US010713151B1

(12) United States Patent
Zinger et al.

(10) Patent No.: US 10,713,151 B1
(45) Date of Patent: Jul. 14, 2020

(54) PROGRAM EXECUTION COVERAGE EXPANSION BY SELECTIVE DATA CAPTURE

(71) Applicant: Microsoft Technology Licensing, LLC, Redmond, WA (US)

(72) Inventors: Arbel Zinger, Tel Aviv (IL); Tomer Schwartz, Tel Aviv (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/387,845

(22) Filed: Apr. 18, 2019

(51) Int. Cl.
  *G06F 9/44* (2018.01)
  *G06F 11/36* (2006.01)
  *G11C 29/00* (2006.01)
  *G11C 29/56* (2006.01)
  *G06N 20/00* (2019.01)
  *G06N 3/08* (2006.01)
(52) U.S. Cl.
  CPC ...... *G06F 11/3676* (2013.01); *G06F 11/3644* (2013.01); *G06F 11/3672* (2013.01); *G06F 11/3684* (2013.01); *G06F 11/3692* (2013.01); *G06F 11/3696* (2013.01); *G06N 3/08* (2013.01); *G06N 20/00* (2019.01); *G11C 29/56008* (2013.01); *G11C 29/70* (2013.01)
(58) Field of Classification Search
  CPC .... G06F 11/3676; G06F 8/66; G06F 11/3688; G06F 11/3672; G06F 11/3692; G06F 11/3684; G06N 3/0445; G06N 3/08; G06N 20/00; G11C 29/56008; G11C 29/70
  See application file for complete search history.

(56) References Cited

U.S. PATENT DOCUMENTS 8,776,029 B2   7/2014  Puthuff
9,396,094 B2 * 7/2016  Browne .............. G06F 11/3676
(Continued)

OTHER PUBLICATIONS

Michal Zalewski, "afl-fuzz: nobody expects CDATA sections in XML", retrieved from <<https://lcamtuf.blogspot.com/2014/11/afl-fuzz-nobody-expects-cdata-sections.html>>, Nov. 30, 2014, 8 pages.

(Continued)

*Primary Examiner* — Tuan A Vu
(74) *Attorney, Agent, or Firm* — Ogilvie Law Firm

(57) ABSTRACT

Program execution coverage is expanded by selectively capturing inputs and execution state information in a production environment after identifying test insufficiencies in a test environment. A program being tested has a non-covered portion and a covered portion. The non-covered portion includes code which is not exercised by a set of tests with regard to an execution coverage, e.g., path coverage, statement coverage, Boolean condition coverage, etc. A non-covered portion identifier identifies the non-covered portion, e.g., by noting breakpoint misses or static analysis constraint solution computational requirements. A trigger inserter inserts a trigger in the program, at a position which permits capture of data which aids exercise of the non-covered portion. A data capturer captures such execution coverage expansion data ("ECE data") in response to trigger activation. Captured ECE data is automatically made available in the test environment, thus expanding code execution coverage of the program in the test environment.

20 Claims, 6 Drawing Sheets

(56) References Cited

U.S. PATENT DOCUMENTS

| | | | | |
|---|---|---|---|---|
| 2002/0120810 A1* | 8/2002 | Brouwer | ............... | G06F 8/66 711/103 |
| 2005/0229044 A1* | 10/2005 | Ball | ............... | G06F 11/3676 714/38.13 |
| 2009/0070738 A1* | 3/2009 | Johnson | ............ | G06F 11/3688 717/106 |
| 2019/0196952 A1* | 6/2019 | Manchiraju | ......... | G06N 3/0445 |

OTHER PUBLICATIONS

"american fuzzy lop (fuzzer)", retrieved from <<https://en.wikipedia.org/wiki/American_fuzzy_lop_(fuzzer)>>, Mar. 8, 2019, 4 pages.

"angr/angr", retrieved from <<https://github.com/angr/angr>>, Mar. 5, 2019, 2 pages.

"Binary recompiler", retrieved from <21 https://en.wikipedia.org/wiki/Binary_recompiler>>, Jan. 27, 2019, 1 page.

"Breakpoint", retrieved from <<https://en.wikipedia.org/wiki/Breakpoint>>, Feb. 22, 2019, 4 pages.

Boyuan Chen, at al., "An Automated Approach to Estimating Code Coverage Measures via Execution Logs", retrieved from <<https://dl.acm.org/citation.cfm?doid=3238147.3238214>>, Sep. 3, 2018, 12 pages.

"Code coverage", retrieved from <<https://en.wikipedia.org/wiki/Code_coverage>>, Dec. 19, 2018, 4 pages.

"Concolic testing", retrieved from <<https://en.wikipedia.org/wiki/Concolic_testing>>, Jan. 24, 2019, 6 pages.

"DFA minimization", retrieved from <<https://en.wikipedia.org/wiki/DFA_minimization>>, Feb. 6, 2019, 6 pages.

"Exception handling", retrieved from <<https://en.wikipedia.org/wiki/Exception_handling>>, Feb. 20, 2019, 10 pages.

"Fuzzing", retrieved from <<https://en.wikipedia.org/wiki/Fuzzing>>, Mar. 7, 2019, 11 pages.

Patrice Godefroid, et al., "Automated Whitebox Fuzz Testing", retrieved from <<https://patricegodefroid.github.io/public_psfiles/ndss2008.pdf>>, 2008, 16 pages.

"Hash function", retrieved from <<https://en.wikipedia.org/wiki/Hash_function>>, Mar. 14, 2019, 7 pages.

"Instrumentation (computer programming)", retrieved from <<https://en.wikipedia.org/wiki/Instrumentation_(computer_programming)>>, Sep. 19, 2018, 2 pages.

James R., "Processor Tracing", retrieved from <<https://software.intel.com/en-us/blogs/2013/09/18/processor-tracing>>, Sep. 18, 2013, 8 pages.

Michal Zalewski, "Pulling JPEGs out of thin air", retrieved from <<https://lcamtuf.blogspot.com/2014/11/pulling-jpegs-put-of-thin-air.html>>, Nov. 7, 2014, 11 pages.

"Satisfiability modulo theories", retrieved from <<https://en.wikipedia.org/wiki/Satisfiability_modulo_theories>>, Mar. 8, 2019, 7 pages.

"Static program analysis", retrieved from <<https://en.wikipedia.org/wiki/Static_program_analysis>>, Feb. 14, 2019, 3 pages.

Gerson Sunye, "A Model-Based Approach for Testing Large Scale Systems", retrieved from <<https://core.ac.uk/download/pdf/46810957.pdf>>, 2015, 117 pages.

"Symbolic execution", retrieved from <<https://en.wikipedia.org/wiki/Symbolic_execution>>, Mar. 4, 2019, 8 pages.

"Tracing (software)", retrieved from <<https://en.wikipedia.org/wiki/Tracing_(software)>>, Jul. 7, 2018, 4 pages.

"Unreachable code", retrieved from <<https://en.wikipedia.org/wiki/Unreachable_code>>, Feb. 19, 2019, 4 pages.

* cited by examiner

PROGRAM EXECUTION COVERAGE EXPANSION BY SELECTIVE DATA CAPTURE

BACKGROUND

A program's complexity can increase very quickly as the program is developed or updated. It often becomes increasingly difficult to detect deficiencies such as logic errors, security vulnerabilities, overlooked input possibilities, and even some typographical errors in the program or its underlying source code. Some errors, such as some misspelled names or some missing parentheses, may be caught by a compiler, but many program deficiencies are not detected by compilers. For instance, a compiler will not catch the mistaken usage of x plus y, or the mistaken usage of x squared, in the place of x times y inside a program function that is meant to calculate an area based on x and y.

Compiled programs may be tested, e.g., by feeding them a set of inputs that should produce a certain known result, and comparing the program output to the desired result. Program inputs can be automatically generated, e.g., by scripts or fuzzer tools. But even with automation the set of possible inputs may be too large to test all of them as a practical matter. For example, it is not feasible to test an internet search engine by checking, for each possible input, whether correct search results are produced. There are too many possibilities, even at a frozen moment in time, and the set of possibilities continually changes. One may optimistically try to test a subset of inputs which is fully representative of all the possibilities, but choosing an input subset that will fully represent all possibilities can be difficult or impossible when the program's deficiencies are unknown, especially if some or all of the program source code is unavailable.

When source code is available, static analysis tools may find problems such as code that can never be reached regardless of the program input, code that may attempt division by zero, code that may cause a buffer overflow when executed, or code that depends on a variable which has not received a value, and so on. But even static analysis might not find every deficiency in a program.

In short, program testing and verification is a complex, challenging, and continually changing area of software development.

SUMMARY

Some teachings herein were motivated by technical challenges of expanding coverage of execution paths, and by the challenges and opportunities presented by potentially leveraging the infrastructure as a cloud provider, or by investigation of ways to use reachable inputs and states created by users and machines in real-life executions in order to identify execution paths and inputs. However, the teachings are not limited to that context. Other technical challenges addressed by the innovations taught here will also be apparent to one of skill informed by the discussion provided below.

Embodiments are presented which perform or provide an expansion of code execution coverage in a test environment. In some embodiments, a program being tested has a non-covered portion and a covered portion. The non-covered portion includes code which is not exercised by a set of tests which exercises the covered portion of the program; the set of tests is insufficient to exercise the non-covered portion of the program, with regard to some kind of execution coverage (path coverage, statement coverage, Boolean condition coverage, and so on). A non-covered portion identifier identifies the non-covered portion. A trigger inserter inserts a trigger in the program, at a position which permits capture of data which exercises the non-covered portion. This data is referred to as "execution coverage expansion data" or "ECE data". A data capturer captures ECE data in response to operation of the trigger. Thus, code execution coverage of the program is expanded in the test environment by the capture of previously unavailable ECE data which exercises program code that was not being exercised by the set of tests. That is, the non-covered portion becomes a covered portion, at least with regard to the additional exercise that is now available in the test environment using the ECE data.

Some embodiments use or perform operations for expanding code execution coverage in a test environment. Such operations may include identifying a non-covered portion of a program. The non-covered portion includes code which is not fully exercised by a set of tests which exercise a covered portion of the program. The operations may also include ascertaining that an execution of the program with data which satisfies one or more conditions on the data would more extensively exercise the non-covered portion, and automatically determining that data which satisfies those conditions is unavailable in the test environment. The operations may also include inserting a trigger in the program, e.g., in a production copy of the program. The trigger is positioned to permit capture of data which exercises the non-covered portion. In response to an activation of the trigger, ECE data (data which exercises the non-covered portion) is automatically captured during an execution of the program. The captured ECE data is made available in the test environment. Then, executing the program with the captured ECE data exercises the non-covered portion and expands code execution coverage of the program in the test environment.

Other technical activities pertinent to teachings herein will also become apparent to those of skill in the art. The examples given are merely illustrative. This Summary is not intended to identify key features or essential features of the claimed subject matter, nor is it intended to be used to limit the scope of the claimed subject matter. Rather, this Summary is provided to introduce—in a simplified form—some technical concepts that are further described below in the Detailed Description. The innovation is defined with claims, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine claim coverage or scope.

DETAILED DESCRIPTION

Overview

Figure 1:
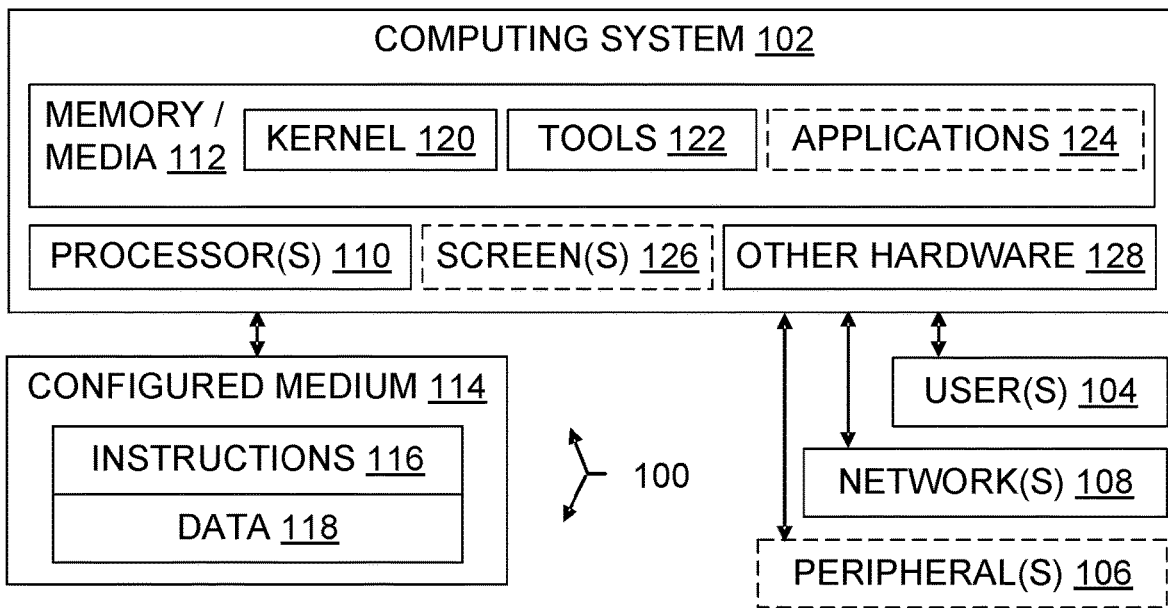
FIG. 1 is a block diagram illustrating computer systems generally and also illustrating configured storage media generally.

Many innovations expand beyond their origins, but understanding an innovation's origins can help one more fully appreciate the innovation. In the present case, some teachings presented herein were motivated by a technical challenge of expanding coverage of execution paths. An associated challenge was how to obtain concrete input from users of cloud services, to assist in the coverage expansion.

One of skill will acknowledge that execution coverage may be a significant tool or goal in several branches of software engineering: design, implementation, security, performance, scalability, reliability, and so on. Many of the techniques used to create this coverage are seriously limited in effect, and many are based on auto-generated data or artificial data that is used as inputs. Others, such as formal verification, require significant investment and cannot be readily implemented on an existing codebase. Teachings provided herein may be applied by persons of skill to help leverage a cloud infrastructure, e.g., as a cloud provider, and to obtain and use reachable inputs and states created by users and machines in real-life executions, in order to help identify execution paths and corresponding inputs. At that point, one can further expand execution path coverage. Using a sufficiently large data set created from activities of users and machines in production use, who execute real actions (as opposed to actions based on artificially generated test data), may help lead one to a much larger coverage than using only classical methods.

Some techniques have some major shortcomings as utilized classically. Fuzzing alone is unwieldy in attempts to cover even some simple states, and generally provides only fake inputs which are not representative of the real inputs the fuzzed program will receive in a production environment. Fuzzing is also sometimes difficult to reliably replicate. Unit-tests are typically human generated and thus subject to human errors and resource constraints such as relatively high cost and lack of scalability. Like fuzzing, unit-tests may also be based on artificial inputs which are not representative of real inputs. Localized unit tests also often fail to reveal problems present in an integrated system built with the tested unit(s). Manual quality assurance, even with some automation, often uses only minimal test cases that are simpler and smaller than the inputs presented in a production setting, without test cases that reach high coverage for complex states. In short, in familiar approaches the input is limited and artificial, and the tested behaviors do not closely resemble real life behavior of users. Beta testing may help, but is generally ad hoc and also misses many actions that will occur in production. Familiar approaches, even beta testing, also often do not scale well.

Some teachings presented herein use or provide a system or method for expanding coverage of execution paths using concrete input from cloud providers' users. In some, after detecting insufficienies in a test environment's exercises of a program, triggers are placed in a production copy of the program to gather inputs and other state information that exercises the program in ways the test environment did not. Then the state information is copied into the test environment, where it can be added to an existing set of tests or serve as a supplemental test suite.

Execution coverage expansion may be implemented in a cloud or on-premises network production environment in various ways. For example, one may deploy breakpoints as triggers in every execution branch, or in every branch not reached by an existing test set. More generally, triggers can be implemented using hardware or software breakpoints, tracing, instrumentation, CPU extensions, and other mechanisms. When a trigger is reached, the cloud provider or on-premises network or other infrastructure provider can duplicate the state that brought the program's process to this branch and this trigger. The state can take various forms, e.g., it can include or be a buffer of network packets, virtual machine state or container state, register state, working memory state, states previously defined using program analytics, file system state, database state, configuration state, or a combination thereof.

This approach allows a suitable computing environment (which may include both the test environment and the production or other capture environment) to reach many (if not all) previously un-reachable branches in a reproducible manner, thus expanding coverage for the execution branch graphs. From there one can continue execution on a replicated portion of the test environment, with extracted concrete values, extracted constraints, fuzzing to expand the new expansion using data found with the triggers, and so on.

The teachings provided herein support using cloud or on-premises network infrastructure and real inputs at scale, as opposed to using minimal or artificial inputs. Using a sufficiently large data set, created by real users and machines executing real actions, may lead to a much larger coverage than the classical methods.

Although path coverage was an initial motivating example, one of skill understands that other kinds of execution coverage can also be expanded by applying teachings provided herein. Unless clearly stated otherwise, "execution coverage" is not limited to execution path coverage, but instead means one or more kinds of execution coverage, e.g., path coverage, statement coverage, function coverage, Boolean condition coverage, parameter value coverage, loop coverage, and so on.

Some embodiments described herein may be viewed by some people in a broader context. For instance, concepts such as analysis, data, execution, expansion, sufficiency, and testing may be deemed relevant to a particular embodiment. However, it does not follow from the availability of a broad context that exclusive rights are being sought herein for abstract ideas; they are not. Rather, the present disclosure is focused on providing appropriately specific embodiments whose technical effects fully or partially solve particular technical problems, such as identifying program code that is not sufficiently tested, and capturing at scale data which supports expansion of execution coverage. Other configured storage media, systems, and processes involving analysis, data, execution, expansion, sufficiency, or testing are outside the present scope. Accordingly, vagueness, mere abstractness, lack of technical character, and accompanying proof problems are also avoided under a proper understanding of the present disclosure.

More generally, one of skill will recognize that not every part of this disclosure, or any particular details therein, are necessarily required to satisfy legal criteria such as enablement, written description, or best mode. Also, embodiments are not limited to the particular source code examples, computing environments, tools, contexts, identifiers, fields, properties, files, data structures, notations, control flows, data flows, pseudocode, or other implementation choices described herein. Any apparent conflict with any other patent disclosure, even from the owner of the present innovations, has no role in interpreting the claims presented in this patent disclosure.

Technical Character

The technical character of embodiments described herein will be apparent to one of ordinary skill in the art, and will also be apparent in several ways to a wide range of attentive readers. Some embodiments address technical activities such as identifying portions of a program which are not exercised during program execution, inserting triggers in programs to capture execution-coverage-expanding data, and making data from a production environment available in a testing environment, each of which includes operations that are deeply rooted in computing technology. Thus, purely mental processes are excluded.

Some embodiments improve the functioning of computing systems by enhancing execution coverage, thereby revealing deficiencies which may include failure to validate inputs, failure to handle certain inputs as desired, buffer overflows, attempted division by zero, reading from uninitialized variables, and so on—one may not realize that a portion of a program misbehaves until that portion is executed with particular problem-inducing data. That is, by applying teachings presented herein, computing systems which perform testing are improved by having their testing scope expanded, and tested computing systems are improved by making their deficiencies known and hence either avoidable or fixable in many cases. Other advantages based on the technical characteristics of the teachings will also be apparent to one of skill from the description provided.

Acronyms, Abbreviations, Names, and Symbols

Some acronyms, abbreviations, names, and symbols are defined below. Others are defined elsewhere herein, or do not require definition here in order to be understood by one of skill.

ALU: arithmetic and logic unit
API: application program interface
ATP: Azure® Advanced Threat Protection (mark of Microsoft Corp.)
BIOS: basic input/output system
CD: compact disc
CPU: central processing unit
DVD: digital versatile disk or digital video disc
ECE: execution coverage expansion
FPGA: field-programmable gate array
FPU: floating point processing unit
GPU: graphical processing unit
GUI: graphical user interface
IaaS or IAAS: infrastructure-as-a-service
ID: identification or identity
IoT: internet of things
IP: internet protocol
LAN: local area network
OS: operating system
PaaS or PAAS: platform-as-a-service
RAM: random access memory
ROM: read only memory
SAT: Boolean satisfiability problem
SMT: satisfiability modulo theory; satisfiability modulo theory problem
UEFI: Unified Extensible Firmware Interface
VM: virtual machine
WAN: wide area network Some Additional Terminology Reference is made herein to exemplary embodiments such as those illustrated in the drawings, and specific language is used herein to describe the same. But alterations and further modifications of the features illustrated herein, and additional technical applications of the abstract principles illustrated by particular embodiments herein, which would occur to one skilled in the relevant art(s) and having possession of this disclosure, should be considered within the scope of the claims.

The meaning of terms is clarified in this disclosure, so the claims should be read with careful attention to these clarifications. Specific examples are given, but those of skill in the relevant art(s) will understand that other examples may also fall within the meaning of the terms used, and within the scope of one or more claims. Terms do not necessarily have the same meaning here that they have in general usage (particularly in non-technical usage), or in the usage of a particular industry, or in a particular dictionary or set of dictionaries. Reference numerals may be used with various phrasings, to help show the breadth of a term. Omission of a reference numeral from a given piece of text does not necessarily mean that the content of a Figure is not being discussed by the text. The inventors assert and exercise the right to specific and chosen lexicography. Quoted terms are being defined explicitly, but a term may also be defined implicitly without using quotation marks. Terms may be defined, either explicitly or implicitly, here in the Detailed Description and/or elsewhere in the application file.

As used herein, a "computer system" (a.k.a. "computing system") may include, for example, one or more servers, motherboards, processing nodes, laptops, tablets, personal computers (portable or not), personal digital assistants, smartphones, smartwatches, smartbands, cell or mobile phones, other mobile devices having at least a processor and a memory, video game systems, augmented reality systems, holographic projection systems, televisions, wearable computing systems, and/or other device(s) providing one or more processors controlled at least in part by instructions. The instructions may be in the form of firmware or other software in memory and/or specialized circuitry.

A "multithreaded" computer system is a computer system which supports multiple execution threads. The term "thread" should be understood to include any code capable of or subject to scheduling (and possibly to synchronization), and may also be known by another name, such as "task," "process," or "coroutine," for example. The threads may run in parallel, in sequence, or in a combination of parallel execution (e.g., multiprocessing) and sequential execution (e.g., time-sliced).

A "processor" is a thread-processing unit, such as a core in a simultaneous multithreading implementation. A processor includes hardware. A given chip may hold one or more processors. Processors may be general purpose, or they may be tailored for specific uses such as vector processing, graphics processing, signal processing, floating-point arithmetic processing, encryption, I/O processing, machine learning, and so on.

"Kernels" include operating systems, hypervisors, virtual machine infrastructure, BIOS or UEFI code, and similar hardware interface software.

"Code" means processor instructions, data (which includes constants, variables, and data structures), or both instructions and data. "Code" and "software" are used interchangeably herein. Executable code, interpreted code, and firmware are some examples of code.

"Program" is used broadly herein, to include applications, kernels, drivers, interrupt handlers, firmware, state machines, libraries, and other code written by programmers (who are also referred to as developers) and/or automatically generated.

"Routine" means a function, a procedure, an exception handler, an interrupt handler, a method, or another block of instructions which receives control via a jump and a context save. A context save pushes a return address on a stack or otherwise saves the return address, and may also save register contents to be restored upon return from the routine.

"Service" means a consumable program offering in a cloud computing environment or other network or computing system environment.

"Cloud" means pooled resources for computing, storage, and networking which are elastically available for measured on-demand service. A cloud may be private, public, community, or a hybrid, and cloud services may be offered in the form of infrastructure as a service, platform as a service, software as a service, or another service. Unless stated otherwise, any discussion of reading from a file or writing to a file includes reading/writing a local file or reading/writing over a network, which may be a cloud network or other network, or doing both (local and networked read/write).

"IoT" or "Internet of Things" means any networked collection of addressable embedded computing nodes. Such nodes are examples of computer systems as defined herein, but they also have at least two of the following characteristics: (a) no local human-readable display; (b) no local keyboard; (c) the primary source of input is sensors that track sources of non-linguistic data; (d) no local rotational disk storage—RAM chips or ROM chips provide the only local memory; (e) no CD or DVD drive; (f) embedment in a household appliance or household fixture; (g) embedment in an implanted or wearable medical device; (h) embedment in a vehicle; (i) embedment in a process automation control system; or (j) a design focused on one of the following: environmental monitoring, civic infrastructure monitoring, industrial equipment monitoring, energy usage monitoring, human or animal health monitoring, physical security, or physical transportation system monitoring. IoT storage may be a target of unauthorized access, either via a cloud, via another network, or via direct local access attempts.

As used herein, "include" allows additional elements (i.e., includes means comprises) unless otherwise stated.

"Optimize" means to improve, not necessarily to perfect. For example, it may be possible to make further improvements in a program or an algorithm which has been optimized.

"Process" is sometimes used herein as a term of the computing science arts, and in that technical sense encompasses resource users, namely, coroutines, threads, tasks, interrupt handlers, application processes, kernel processes, procedures, and object methods, for example. "Process" is also used herein as a patent law term of art, e.g., in describing a process claim as opposed to a system claim or an article of manufacture (configured storage medium) claim. Similarly, "method" is used herein at times as a technical term in the computing science arts (a kind of "routine") and also as a patent law term of art (a "process"). "Process" and "method" in the patent law sense are used interchangeably herein. Those of skill will understand which meaning is intended in a particular instance, and will also understand that a given claimed process or method (in the patent law sense) may sometimes be implemented using one or more processes or methods (in the computing science sense).

"Automatically" means by use of automation (e.g., general purpose computing hardware configured by software for specific operations and technical effects discussed herein), as opposed to without automation. In particular, steps performed "automatically" are not performed by hand on paper or in a person's mind, although they may be initiated by a human person or guided interactively by a human person. Automatic steps are performed with a machine in order to obtain one or more technical effects that would not be realized without the technical interactions thus provided.

One of skill understands that technical effects are the presumptive purpose of a technical embodiment. The mere fact that calculation is involved in an embodiment, for example, and that some calculations can also be performed without technical components (e.g., by paper and pencil, or even as mental steps) does not remove the presence of the technical effects or alter the concrete and technical nature of the embodiment. Operations such as inserting a trigger in a program, capturing data in response to activation of a trigger, executing a portion of a program, performing static analysis of program code, performing fuzzing testing of software programs, concolic testing of programs, symbolic execution of programs, executing non-linear calculations with a processor, iterating through a program loop, and many other operations discussed herein, are understood as inherently digital. A human mind cannot interface directly with a CPU or other processor, or with RAM or other digital storage, to read and write the necessary data to perform the execution coverage expansion steps taught herein. This would all be well understood by persons of skill in the art in view of the present disclosure, but others may sometimes need to be informed or reminded of the facts.

Unless stated otherwise, embodiments are presumed to be capable of operating at production scale in commercial production environments when properly configured and supplied with data, or in testing labs for production environments, as opposed to being mere thought experiments. "Production scale" means capturing ECE data or executing tests with ECE data from at least five different legally independent entities. As to the meaning of "legally independent" for the purpose of assessing production scale, individuals who are not employed by or paid by a corporate, governmental, or institutional entity are legally independent of that entity, for example. As another set of examples, corporate entities which are not affiliates or jointly owned by a third entity are legally independent of one another, and are legally independent from governmental entities and from non-profit educational entities. By contrast, accounts owned by a single business do not represent legally independent entities. Similarly, accounts owned by a single individual do not represent legally independent entities. Notwithstanding the foregoing, one of skill will acknowledge that claimed embodiments have utility for standalone use, e.g., where a developer uses the same system when building a product and testing the product.

"Computationally" likewise means a computing device (processor plus memory, at least) is being used, and excludes obtaining a result by mere human thought or mere human action alone. For example, doing arithmetic with a paper and pencil is not doing arithmetic computationally as understood herein. Computational results are faster, broader, deeper, more accurate, more consistent, more comprehensive, and/or otherwise provide technical effects that are beyond the scope of human performance alone. "Computational steps" are steps performed computationally. Neither "automatically" nor "computationally" necessarily means "immediately". "Computationally" and "automatically" are used interchangeably herein.

"Proactively" means without a direct request from a user. Indeed, a user may not even realize that a proactive step by an embodiment was possible until a result of the step has been presented to the user. Except as otherwise stated, any computational and/or automatic step described herein may also be done proactively.

Throughout this document, use of the optional plural "(s)", "(es)", or "(ies)" means that one or more of the indicated features is present. For example, "processor(s)" means "one or more processors" or equivalently "at least one processor".

For the purposes of United States law and practice, use of the word "step" herein, in the claims or elsewhere, is not intended to invoke means-plus-function, step-plus-function, or 35 United State Code Section 112 Sixth Paragraph/Section 112(f) claim interpretation. Any presumption to that effect is hereby explicitly rebutted.

For the purposes of United States law and practice, the claims are not intended to invoke means-plus-function interpretation unless they use the phrase "means for". Claim language intended to be interpreted as means-plus-function language, if any, will expressly recite that intention by using the phrase "means for". When means-plus-function interpretation applies, whether by use of "means for" and/or by a court's legal construction of claim language, the means recited in the specification for a given noun or a given verb should be understood to be linked to the claim language and linked together herein by virtue of any of the following: appearance within the same block in a block diagram of the figures, denotation by the same or a similar name, denotation by the same reference numeral, a functional relationship depicted in any of the figures, a functional relationship noted in the present disclosure's text. For example, if a claim limitation recited a "zac widget" and that claim limitation became subject to means-plus-function interpretation, then at a minimum all structures identified anywhere in the specification in any figure block, paragraph, or example mentioning "zac widget", or tied together by any reference numeral assigned to a zac widget, or disclosed as having a functional relationship with the structure or operation of a zac widget, would be deemed part of the structures identified in the application for zac widgets and would help define the set of equivalents for zac widget structures.

Throughout this document, unless expressly stated otherwise any reference to a step in a process presumes that the step may be performed directly by a party of interest and/or performed indirectly by the party through intervening mechanisms and/or intervening entities, and still lie within the scope of the step. That is, direct performance of the step by the party of interest is not required unless direct performance is an expressly stated requirement. For example, a step involving action by a party of interest such as activating, analyzing, ascertaining, calculating, capturing, conditioning, covering, detecting, determining, employing, encountering, executing, exercising, expanding, fuzzing, hashing, hooking, identifying, inserting, iterating, looping, making, noting, obtaining, operating, positioning, protecting, randomizing, removing, rewriting, satisfying, solving, testing, triggering (and activates, activated, analyzes, analyzed, etc.) with regard to a destination or other subject may involve intervening action such as forwarding, copying, uploading, downloading, encoding, decoding, compressing, decompressing, encrypting, decrypting, authenticating, invoking, and so on by some other party, including any action recited in this document, yet still be understood as being performed directly by the party of interest.

Whenever reference is made to data or instructions, it is understood that these items configure a computer-readable memory and/or computer-readable storage medium, thereby transforming it to a particular article, as opposed to simply existing on paper, in a person's mind, or as a mere signal being propagated on a wire, for example. For the purposes of patent protection in the United States, a memory or other computer-readable storage medium is not a propagating signal or a carrier wave or mere energy outside the scope of patentable subject matter under United States Patent and Trademark Office (USPTO) interpretation of the In re Nuijten case. No claim covers a signal per se or mere energy in the United States, and any claim interpretation that asserts otherwise in view of the present disclosure is unreasonable on its face. Unless expressly stated otherwise in a claim granted outside the United States, a claim does not cover a signal per se or mere energy.

Moreover, notwithstanding anything apparently to the contrary elsewhere herein, a clear distinction is to be understood between (a) computer readable storage media and computer readable memory, on the one hand, and (b) transmission media, also referred to as signal media, on the other hand. A transmission medium is a propagating signal or a carrier wave computer readable medium. By contrast, computer readable storage media and computer readable memory are not propagating signal or carrier wave computer readable media. Unless expressly stated otherwise in the claim, "computer readable medium" means a computer readable storage medium, not a propagating signal per se and not mere energy.

An "embodiment" herein is an example. The term "embodiment" is not interchangeable with "the invention". Embodiments may freely share or borrow aspects to create other embodiments (provided the result is operable), even if a resulting combination of aspects is not explicitly described per se herein. Requiring each and every permitted combination to be explicitly and individually described is unnecessary for one of skill in the art, and would be contrary to policies which recognize that patent specifications are written for readers who are skilled in the art. Formal combinatorial calculations and informal common intuition regarding the number of possible combinations arising from even a small number of combinable features will also indicate that a large number of aspect combinations exist for the aspects described herein. Accordingly, requiring an explicit recitation of each and every combination would be contrary to policies calling for patent specifications to be concise and for readers to be knowledgeable in the technical fields concerned.

List of Reference Numerals

The following list is provided for convenience and in support of the drawing figures and as part of the text of the specification, which describe innovations by reference to multiple items. Items not listed here may nonetheless be part of a given embodiment. For better legibility of the text, a given reference number is recited near some, but not all, recitations of the referenced item in the text. The same reference number may be used with reference to different examples or different instances of a given item. The list of reference numerals is:

100 operating environment, also referred to as computing environment
102 computer system, also referred to as computational system or computing system
104 users
106 peripherals
108 network generally, including, e.g., LANs, WANs, software defined networks, clouds, and other wired or wireless networks
110 processor
112 computer-readable storage medium, e.g., RAM, hard disks
114 removable configured computer-readable storage medium
116 instructions executable with processor; may be on removable storage media or in other memory (volatile or non-volatile or both)
118 data generally
120 kernel(s), e.g., operating system(s), BIOS, UEFI, device drivers, hypervisors
122 tools, e.g., cybersecurity tools, packet sniffer software, debuggers, profilers, compilers, interpreters, static code analysis tools, fuzzers, SMT solvers, SAT solvers, testing tools, software development tools and tool suites, hardware development tools and tool suites, diagnostics
124 applications, e.g., word processors, web browsers, spreadsheets, games, email tools
126 display screens, also referred to as "displays"
128 computing hardware not otherwise associated with a reference number 106, 108, 110, 112, 114
202 inputs to a program 208; may come from human users 104, or from other software, or both
204 capture environment; a computing environment in which ECE data is captured during execution of a program
206 test environment; a computing environment in a program is tested
208 program, which may be or include, e.g. an application 124, a kernel 120, or other software
210 capture copy of a program 208, namely, copy configured for execution in a capture environment, e.g., with ECE data capture triggers
212 test copy of a program 208, namely, copy configured for execution in a test environment, e.g., with privacy protections for captured ECE data, etc.
214 execution coverage expansion (ECE) data, namely, data which aids expansion of execution coverage during program testing
216 tests to exercise portions of a program; may also be referred to as "test set" or "test suite"; numeral 216 may also refer to the action of testing
218 corpus of inputs, e.g., source data for fuzzing tests
220 software testing tools, e.g., static code analysis tools, fuzzers, SMT solvers, SAT solvers, test automation tools, test script recording and playback tools, parallel test execution tools, etc.
302 cloud; may also be referred to as "cloud computing environment"
304 virtual machine; although containers differ from virtual machines as to inclusion of a guest operating system, containers and virtual machines are functionally similar for purposes of the present disclosure, and therefore unless indicated otherwise any reference to virtual machines also refers to containers
306 production environment; may be used as a capture environment
400 computing system configured with execution coverage expansion functionality
402 portion of program whose execution is covered by given tests 216, with regard to coverage (path, statement, loop, etc.) of interest to developer or otherwise relevant to testing; also referred to as "covered portion"
404 portion of program whose execution is not covered by given tests 216, with regard to coverage (path, statement, loop, etc.) of interest to developer or otherwise relevant to testing; also referred to as "non-covered portion"
406 tool, script, or other identifier of a non-covered portion
408 trigger
410 trigger inserter; may also be referred to as "trigger insertion code" or "trigger insertion tool"
412 data capturer; may also be referred to as "data capture code" or "data capture tool"
414 test set insufficiency detector; may also be referred to as "test set insufficiency detection code" or "test set insufficiency detection tool"
502 tests 216 which use fuzzed inputs
504 fuzzers
506 concolic tests 216
508 concolic test generation tools
510 SMT solvers
512 SAT solvers
514 constraints identified by SMT solver or SAT solver
516 symbolic execution of a program
518 tests 216 which use symbolic execution
520 symbolic execution tool
522 static analysis of a program
524 static analysis tool
526 memory requirement, namely, limitation on amount of memory available to accomplish particular testing or analysis
528 time requirement, namely, limitation on amount of time available to accomplish particular testing or analysis; time may be measured as wall clock time, or processor cycles, or computing system ticks, for example; although memory and time are called out separately herein, one of skill will acknowledge that in many situations they are tradeoffs against one another, e.g., computations can be performed faster by using more memory or computations can be performed with less memory in ways that also slow them down
530 tests of an integrated system of units which checks unit interoperability, inter-unit communication, accumulation of results by units, or other aspects of operation beyond the operation of a unit in isolation from other units
532 component (a.k.a. "unit") which may be integrated with other components to form an integrated system; an integrated system is an example of a computing system 102
534 component test; may also be referred to as "unit test"; tests the operation of a unit in isolation from other units
600 implementation mechanisms for triggers 408
602 hardware breakpoint
604 software breakpoint
606 binary rewrite
608 watchpoint
610 compiler; an example of a tool 122

Figure 10:
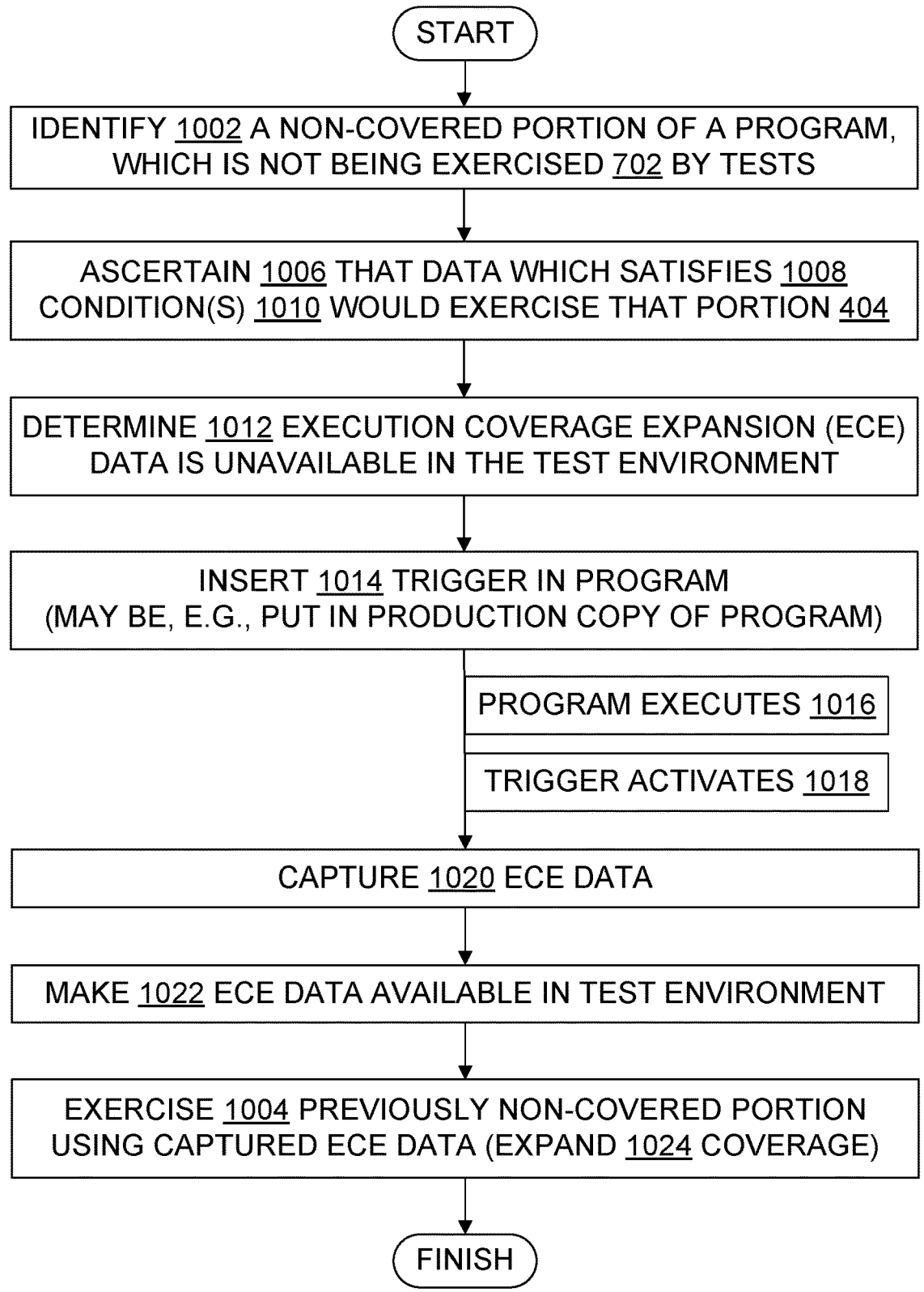
FIG. 10 is a flowchart illustrating some example execution coverage expansion methods.

612 instrumentation placed in program by a compiler
614 off-CPU peripheral
616 CPU capability (in the CPU)
618 CPU extension
620 dynamic hook, dynamic hooking, e.g., change a routine address in a jump table or virtual function table or set of interrupt vectors
702 code exercise; also referred to as "code execution" or simply as "execution" or "exercise"; includes aiding exercise of code when referring to data 214 that exercises code
704 condition(s) on whether a portion of code gets exercised during the execution of a program
706 constraints 514 which are unsolvable within specified time or memory limits 528, 526 using static analysis tools 524 available in a given test environment
708 expression which involves obtaining or calculating a hash 710
710 hash, namely, a fixed size number based on a variable sized input; not necessarily a cryptographically secure hash, but may be
712 non-linear calculation
714 loop which is "hard" in the sense that available static analysis tools 524 do not solve constraints needed to find data that will ensure desired exercise of the loop's condition and body
716 hard loop which is input-dependent with a condition
718 non-deterministic condition controlling whether a portion of code is exercised
720 expression which involves obtaining or calculating a randomized value
722 randomized value; may be generated by a cryptographically secure random number generator, or not; may be merely pseudo-random
724 gap or omission in corpus 218 of testing input values
726 mutation algorithm used to generate additional test input values from corpus 218, e.g., by fuzzing or enumeration of possible values guided by a regular expression or a dictionary traversal or a lookup
728 unsolved instance of SMT problem or SAT problem
802 execution coverage; also referred to as "coverage"; may refer to execution coverage generally, or may be qualified by context to refer to one or more particular kinds of execution coverage
804 execution path
806 execution path coverage, that is, a set of execution paths of a particular program (which is explicitly identified or implied by context) with respect to exercise of that program by a particular set of tests or other items which is explicitly identified or implied by context, e.g., by users in a production environment
808 function or other routine
810 function coverage, that is, a set of functions or other routines of a particular program (which is explicitly identified or implied by context) with respect to exercise of that program by a particular set of tests or other items which is explicitly identified or implied by context, e.g., by users in a production environment
812 statement (in a programming language sense)
814 statement coverage, that is, a set of statements of a particular program (which is explicitly identified or implied by context) with respect to exercise of that program by a particular set of tests or other items which is explicitly identified or implied by context, e.g., by users in a production environment
816 control flow graph
818 edge in a control flow graph
820 edge coverage, that is, a set of control flow graph edges of a particular program (which is explicitly identified or implied by context) with respect to exercise of that program by a particular set of tests or other items which is explicitly identified or implied by context, e.g., by users in a production environment; may also be referred to as "control flow graph coverage"
822 Boolean condition sub-expression
824 value of Boolean condition sub-expression
826 Boolean condition as a whole
828 Boolean condition coverage, that is, a set of Boolean condition sub-expressions or Boolean condition sub-expression values, or both, of a particular Boolean condition of a particular program (which is explicitly identified or implied by context) with respect to exercise of that program by a particular set of tests or other items which is explicitly identified or implied by context, e.g., by users in a production environment
830 parameter of a routine or other parameterized code, e.g., machine learning model parameter, message,
832 parameter value, i.e., an argument or value which is passed and corresponds to a parameter in a particular exercise of the parameterized code
834 parameter value coverage, that is, a set of parameter values of a particular parameterized code of a particular program (which is explicitly identified or implied by context) with respect to exercise of that program by a particular set of tests or other items which is explicitly identified or implied by context, e.g., by users in a production environment
836 loop
838 loop iteration count; may be a specific number of iterations or a range of iterations, e.g., some examples of loop iteration counts are: zero, one, more than one
840 loop iteration count coverage, that is, a set of loop iteration count values of a particular loop of a particular program (which is explicitly identified or implied by context) with respect to exercise of that program by a particular set of tests or other items which is explicitly identified or implied by context, e.g., by users in a production environment; may also be referred to as "loop coverage"
902 network packets; may refer, e.g., to level two frames or level three packets
904 virtual machine state, e.g., code and data and instruction pointers at a particular point in the execution of a virtual machine; may also include metadata such as one or more of the launch timestamp, number of instances, hypervisor identity, privileges, owner, compatibility, and security context of the virtual machine; for purposes of the present disclosure, containers are largely similar to virtual machines in that both have a state, both have particular coverage with regard to their test suites, both can run in test or capture environments, both can have triggers inserted to capture ECE data, and so on
906 register of a processor 110
908 register state, i.e., value contained in the register at a particular point in the execution of a program
910 application memory, e.g., portion of RAM assigned to an application program plus portion of non-volatile storage assigned to the application program
912 application memory state, i.e., values contained in the application memory at a particular point in the execution of the application program 914 kernel memory, e.g., portion of RAM assigned to a kernel program plus portion of non-volatile storage assigned to the kernel program 916 kernel memory state, i.e., values contained in the kernel memory at a particular point in the execution of the kernel program; this may include hypervisor data when a hypervisor provides kernel functionality 1000 flowchart; 1000 also refers to execution coverage expansion methods illustrated by or consistent with the FIG. 10 flowchart 1002 identify a non-covered portion of a program 1006 ascertain the constraints or conditions on ECE data or otherwise characterize ECE data in a manner that permits it to be automatically recognized and automatically captured during an execution 1008 satisfy constraints or conditions on ECE data, i.e., meet those constraints or conditions with particular captured (or otherwise obtained) data 1010 constraints or conditions on ECE data 1012 determine that desired ECE data is not available in a given test environment at a given time 1014 insert a trigger in a program at a point in the program's execution where desired ECE data is in a readable memory and otherwise available to be captured (e.g., not encrypted or anonymized)

1016 execute at least part of a program 1018 activate a trigger 408

1020 capture ECE data, e.g., by copying it to a buffer or other memory from which it can then be copied or moved to a test environment 1022 make ECE data available by copying it or moving a copy of it to a test environment; "copy" refers here to an original instance or a copy thereof 1024 expand execution path coverage of a program 208 with regard to at least one kind of coverage 802 and a particular test suite 216, by obtaining a usable instance of ECE data which will exercise a previously non-covered portion of the program 1100 flowchart; 1100 also refers to execution coverage expansion methods illustrated by or consistent with the FIG. 11 flowchart, which incorporates the steps of FIG. 10

1102 detect an insufficiency of a test suite 216, e.g., detect that data to exercise a non-covered portion is not available in the test suite, or that such data is not reachable (such as by mutation or automatic generation) within a prescribed computational resource limit from the available data, or both 1104 lack or omit a particular kind of program test; applies to a test suite or a test environment, 1106 solve constraints or conditions within a prescribed computational resource limit and thereby bring ECE data within reach 1108 fail to solve constraints or conditions within a prescribed computational resource limit and thereby fail to bring ECE data within reach 1110 impose a condition on exercise of a portion of code, e.g., make the code portion's exercise subject to a Boolean condition or to the result of a routine invocation 1112 monitor program execution in a cloud or an on-premises network 1114 remove a trigger 408 from a program (that is, from at least one copy of the program)

1116 locate code which is subject to an exercise condition 1118 calculate or otherwise obtain (e.g., by look-up or query) a hash value 710

1120 calculate or otherwise obtain (e.g., through an API) a randomized value 1122 perform a non-linear calculation, that is, a calculation which is not analyzable by a SAT solver or SMT solver through solution of a set of linear constraints 1124 perform a non-deterministic computation 1126 note an unsolved satisfiability instance 1128 encounter a component or security or privacy or other computing system boundary 1130 component boundary or security boundary or privacy boundary or other computing system boundary 1132 take computational steps or assign computational resources, or both, to enhance privacy or other security protection of data 1134 any step discussed in the present disclosure that has not been assigned some other reference numeral 1136 obtain at least one condition on the ECE data Operating Environments With reference to FIG. 1, an operating environment 100 for an embodiment includes at least one computer system 102. The computer system 102 may be a multiprocessor computer system, or not. An operating environment may include one or more machines in a given computer system, which may be clustered, client-server networked, and/or peer-to-peer networked within a cloud or an on-premises network. An individual machine is a computer system, and a group of cooperating machines is also a computer system. A given computer system 102 may be configured for end-users, e.g., with applications, for administrators, as a server, as a distributed processing node, and/or in other ways.

The operating environment 100 may be conceptually or functionally divided into constituent environments. For example, in some examples the operating environment 100 of a business enterprise may include two or more of: a development environment 100, a research environment 100, a product testing environment 100, and a production (consumer-facing) environment 100. A given computing system may be as small as a single machine or single device, or may be as large as a network of machines that span multiple constituent environments 100.

Human users 104 may interact with the computer system 102 by using displays, keyboards, and other peripherals 106, via typed text, touch, voice, movement, computer vision, gestures, and/or other forms of I/O. A screen 126 may be a removable peripheral 106 or may be an integral part of the system 102. A user interface may support interaction between an embodiment and one or more human users. A user interface may include a command line interface, a graphical user interface (GUI), natural user interface (NUI), voice command interface, and/or other user interface (UI) presentations, which may be presented as distinct options or may be integrated.

System administrators, network administrators, cloud administrators, security analysts and other security personnel, operations personnel, developers, testers, engineers, auditors, and end-users are each a particular type of user 104. Automated agents, scripts, playback software, devices, and the like acting on behalf of one or more people may also be users 104, e.g., to facilitate testing a system 102. Storage devices and/or networking devices may be considered peripheral equipment in some embodiments and part of a system 102 in other embodiments, depending on their detachability from the processor 110. Other computer systems not shown in FIG. 1 may interact in technological ways with the computer system 102 or with another system embodiment using one or more connections to a network 108 via network interface equipment, for example.

Each computer system 102 includes at least one processor 110. The computer system 102, like other suitable systems, also includes one or more computer-readable storage media 112. Storage media 112 may be of different physical types. The storage media 112 may be volatile memory, non-volatile memory, fixed in place media, removable media, magnetic media, optical media, solid-state media, and/or of other types of physical durable storage media (as opposed to merely a propagated signal or mere energy). In particular, a configured storage medium 114 such as a portable (i.e., external) hard drive, CD, DVD, memory stick, or other removable non-volatile memory medium may become functionally a technological part of the computer system when inserted or otherwise installed, making its content accessible for interaction with and use by processor 110. The removable configured storage medium 114 is an example of a computer-readable storage medium 112. Some other examples of computer-readable storage media 112 include built-in RAM, ROM, hard disks, and other memory storage devices which are not readily removable by users 104. For compliance with current United States patent requirements, neither a computer-readable medium nor a computer-readable storage medium nor a computer-readable memory is a signal per se or mere energy under any claim pending or granted in the United States.

The storage medium 114 is configured with binary instructions 116 that are executable by a processor 110; "executable" is used in a broad sense herein to include machine code, interpretable code, bytecode, and/or code that runs on a virtual machine or container, for example. The storage medium 114 is also configured with data 118 which is created, modified, referenced, and/or otherwise used for technical effect by execution of the instructions 116. The instructions 116 and the data 118 configure the memory or other storage medium 114 in which they reside; when that memory or other computer readable storage medium is a functional part of a given computer system, the instructions 116 and data 118 also configure that computer system. In some embodiments, a portion of the data 118 is representative of real-world items such as product characteristics, inventories, physical measurements, settings, images, readings, targets, volumes, and so forth. Such data is also transformed by backup, restore, commits, aborts, reformatting, and/or other technical operations.

Although an embodiment may be described as being implemented as software instructions executed by one or more processors in a computing device (e.g., general purpose computer, server, or cluster), such description is not meant to exhaust all possible embodiments. One of skill will understand that the same or similar functionality can also often be implemented, in whole or in part, directly in hardware logic, to provide the same or similar technical effects. Alternatively, or in addition to software implementation, the technical functionality described herein can be performed, at least in part, by one or more hardware logic components. For example, and without excluding other implementations, an embodiment may include hardware logic components 110, 128 such as Field-Programmable Gate Arrays (FPGAs), Application-Specific Integrated Circuits (ASICs), Application-Specific Standard Products (ASSPs), System-on-a-Chip components (SOCs), Complex Programmable Logic Devices (CPLDs), and similar components. Components of an embodiment may be grouped into interacting functional modules based on their inputs, outputs, and/or their technical effects, for example.

In addition to processors 110 (e.g., CPUs, ALUs, FPUs, and/or GPUs), memory/storage media 112, and displays 126, an operating environment may also include other hardware 128, such as batteries, buses, power supplies, wired and wireless network interface cards, for instance. The nouns "screen" and "display" are used interchangeably herein. A display 126 may include one or more touch screens, screens responsive to input from a pen or tablet, or screens which operate solely for output. In some embodiments peripherals 106 such as human user I/O devices (screen, keyboard, mouse, tablet, microphone, speaker, motion sensor, etc.) will be present in operable communication with one or more processors 110 and memory.

In some embodiments, the system includes multiple computers connected by a wired and/or wireless network 108. Networking interface equipment 128 can provide access to networks 108, using network components such as a packet-switched network interface card, a wireless transceiver, or a telephone network interface, for example, which may be present in a given computer system. Virtualizations of networking interface equipment and other network components such as switches or routers or firewalls may also be present, e.g., in a software defined network or a sandboxed or other secure cloud computing environment. A given embodiment may also communicate technical data and/or technical instructions through direct memory access, removable nonvolatile storage media, or other information storage-retrieval and/or transmission approaches.

One of skill will appreciate that the foregoing aspects and other aspects presented herein under "Operating Environments" may form part of a given embodiment. This document's headings are not intended to provide a strict classification of features into embodiment and non-embodiment feature sets.

One or more items are shown in outline form in the Figures, or listed inside parentheses, to emphasize that they are not necessarily part of the illustrated operating environment or all embodiments, but may interoperate with items in the operating environment or some embodiments as discussed herein. It does not follow that items not in outline or parenthetical form are necessarily required, in any Figure or any embodiment. In particular, FIG. 1 is provided for convenience; inclusion of an item in FIG. 1 does not imply that the item, or the described use of the item, was known prior to the current innovations.

More About Systems

With reference to FIGS. 1 through 9, some embodiments use or provide a functionality-enhanced execution coverage expansion system 400. The enhanced system 400 enhances a target system by expanding execution coverage of the target system 102. The target system may be the enhanced system 400 itself, or be another computing system 102, or may include both. The enhanced system 400 distinguishes between covered and non-covered portions of a program 208, and inserts triggers 408 into the program to help capture data 214 that will exercise the non-covered portions 404.

A given portion of the program 208 is thus covered or non-covered with respect to a particular time; non-covered portions 404 become covered portions 402 as part of execution coverage expansion. A given portion of the program is also covered or non-covered with respect to a particular set of tests 216, since one test suite may exercise different parts of the program than another test suite 216. In addition, a given portion of the program is covered or non-covered with respect to one or more particular kinds of execution coverage. For example, a program portion containing a loop condition and loop body may be covered with respect to path coverage because a test set gives the loop condition a value that causes an execution of the loop body, whereas the same portion is not covered with respect to loop coverage because the test set does not cause any execution that skips over the loop body, or does not cause execution of the loop body multiple times.

Figure 2:
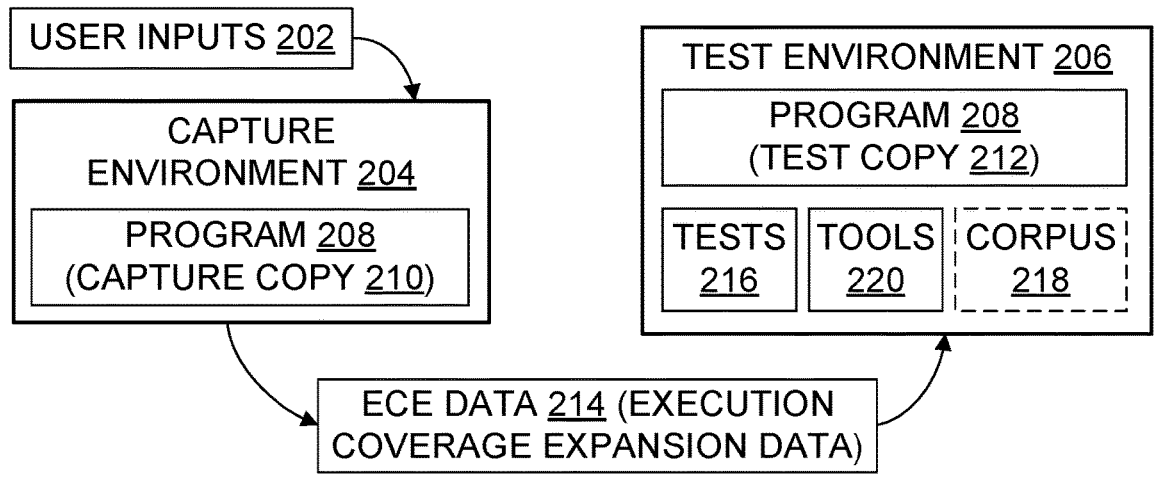
FIG. 2 is a block diagram illustrating some aspects of two environments in an overall computing system, including provision in a test environment of execution coverage expansion data ("ECE data") which was captured in a capture environment.

FIG. 2 shows an example overall environment 100 having a constituent capture environment 204 and a constituent test environment 206. In this example system architecture, user inputs 202 enter the capture environment 204, where some of them activate triggers in a capture copy 210 of a program 208, resulting in the capture of ECE data 214. Captured inputs, state information, and other ECE data 214 is transferred or copied or otherwise made accessible in the test environment 206. It can be used there to expand the execution coverage of a test copy 212 of the program. For instance, data 214 may be added to a suite of tests 216 performed by tools 220 using a corpus of inputs 218.

Figure 3:
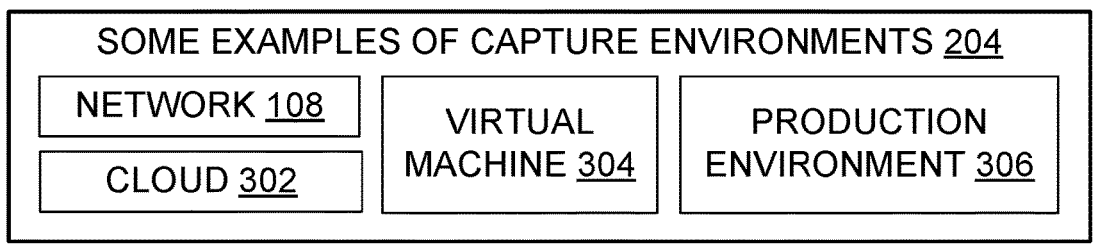
FIG. 3 is a block diagram illustrating some examples of ECE data capture environments.

FIG. 3 shows some examples of capture environments 204. The examples shown include networks 108, clouds 302 (e.g., Microsoft Azure® and other cloud environments; mark of Microsoft Corporation), virtual machines 304 and containers, and production environments 306. Some other capture environment 204 examples include local systems 102, local processes, scripts, development environments, and testing environments.

Figure 4:
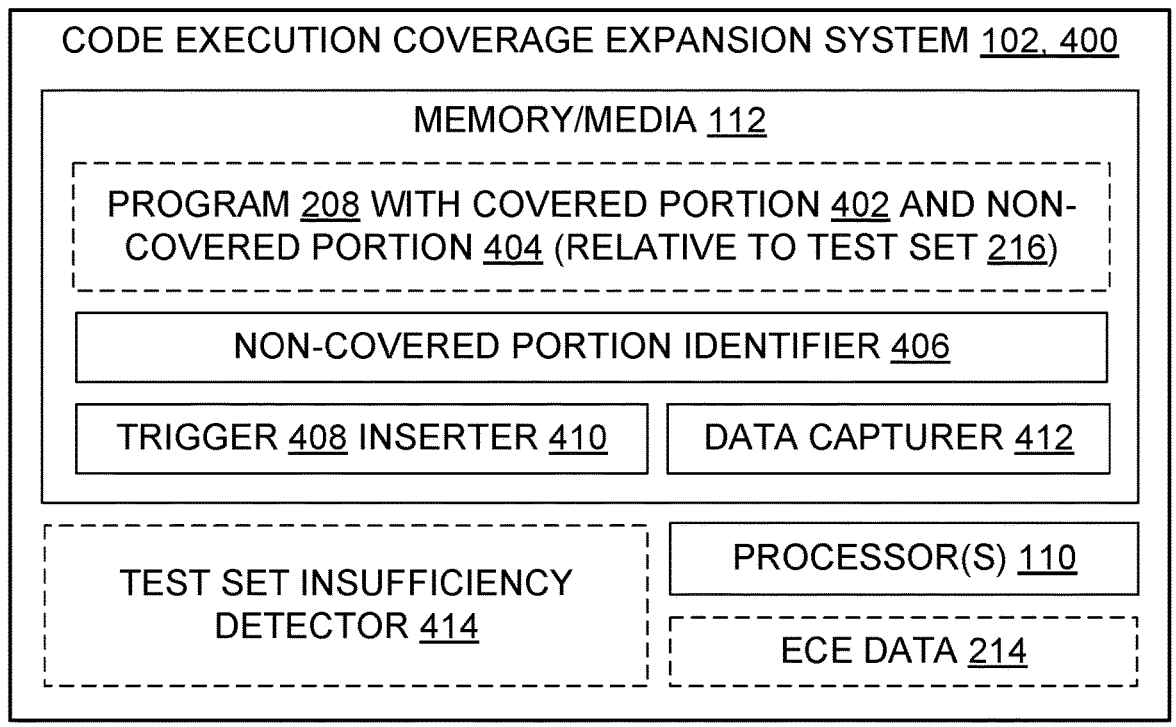
FIG. 4 is a block diagram illustrating aspects of a system which is configured for code execution coverage expansion.

FIG. 4 shows an example execution coverage expansion system 400. The illustrated system 400 includes functionality 406 to identify a non-covered portion 404 of a program and functionality 410 to insert a trigger in the program at a point where that portion 404 will get exercised or is being exercised. For instance, if the body of a loop or a branch of a switch is not being exercised, then the trigger could be inserted "above" the first instruction 116 of that loop body or that branch. The illustrated system 400 also includes functionality 412 to capture ECE data 214 when the trigger is activated. Depending on the implementation, "above" may mean that the trigger will happen right before the instruction takes place (e.g., through a breakpoint or an instruction trace). Having the trigger directly "above" the instruction may be accomplished in some implementations by having another instruction to trigger collection, e.g., through compiler instrumentation or binary instrumentation. More generally, the term "above" with regard to an instruction is understood as "before or when the instruction runs".

Figure 5:
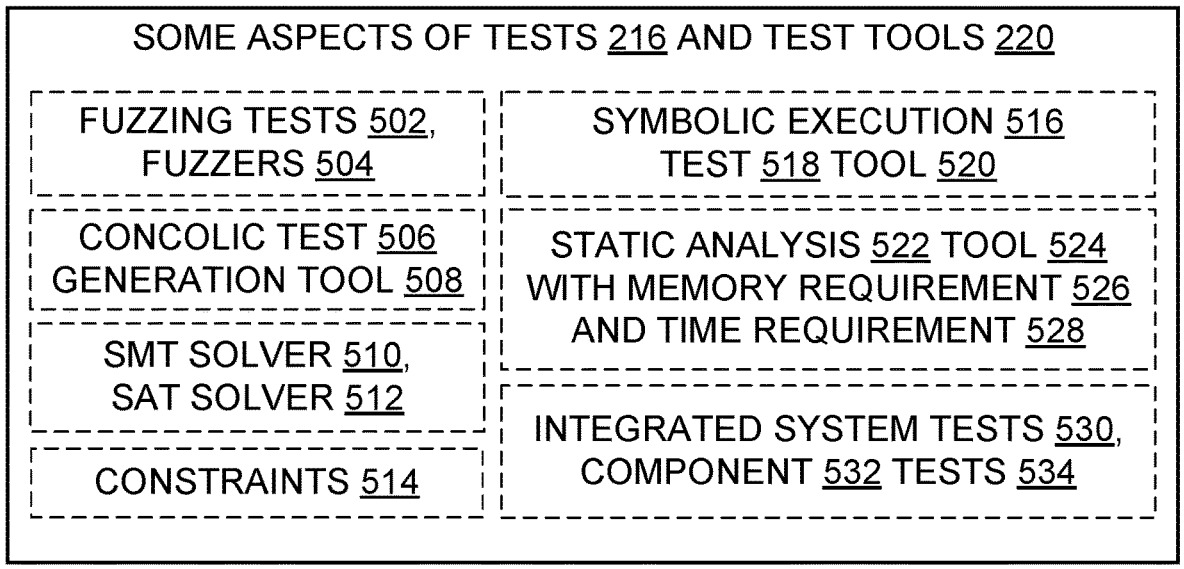
FIG. 5 is a block diagram illustrating some aspects of program tests and program test tools.

FIG. 5 shows some aspects of tests 216 and test tools 220. Whether a portion is covered or non-covered depends in part on what tests are used as the context; one test may cover what another test does not cover. Accordingly, examples of tests are discussed herein, including some examples shown in FIG. 5. They include fuzzing tests 502 performed using fuzzers 504, concolic tests 506 generated by corresponding tools 508, symbolic execution tests 518 performed with corresponding tools 520, integrated system tests 503, and component (a.k.a. "unit") tests 534. Coverage may also be determined in part by what inputs are fed to a tested program, and desirable inputs may sometimes be identified using static analysis tools 524, SMT solvers 510, or SAT solvers 512. One of skill will acknowledge that teachings provided herein may also be applied in some circumstances with some manual testing. An embodiment may involve circumstances wherein, instead of creating an initial corpus for a fuzzer, manual quality assurance happens directly on top of an environment with the embodiment system 400 as a harness. This can provide a kind of input-less fuzzer, based on manual testing.

As to unit test insufficiency, a misuse of API calls provides an example. A unit test 534 that uses a stub (mock object) may work if the stub doesn't fully reproduce the intricacies of the actual API, but fail when execution testing tries to run the integrated system.

Figure 6:
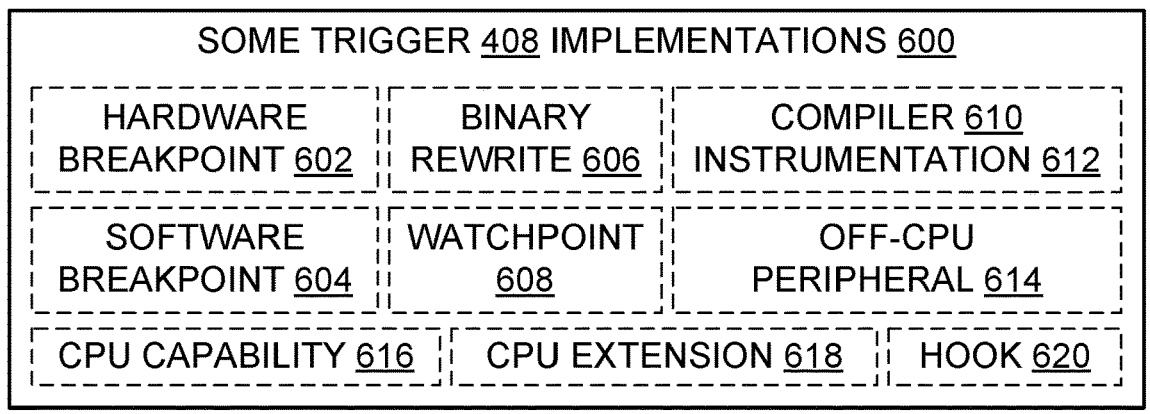
FIG. 6 is a block diagram illustrating some ECE data capture trigger implementations.

FIG. 6 shows some trigger 408 implementations 600. These are enumerated elsewhere herein. One of skill will acknowledge that instruction trace and branch trace are examples of a CPU capability 616.

Figure 7:
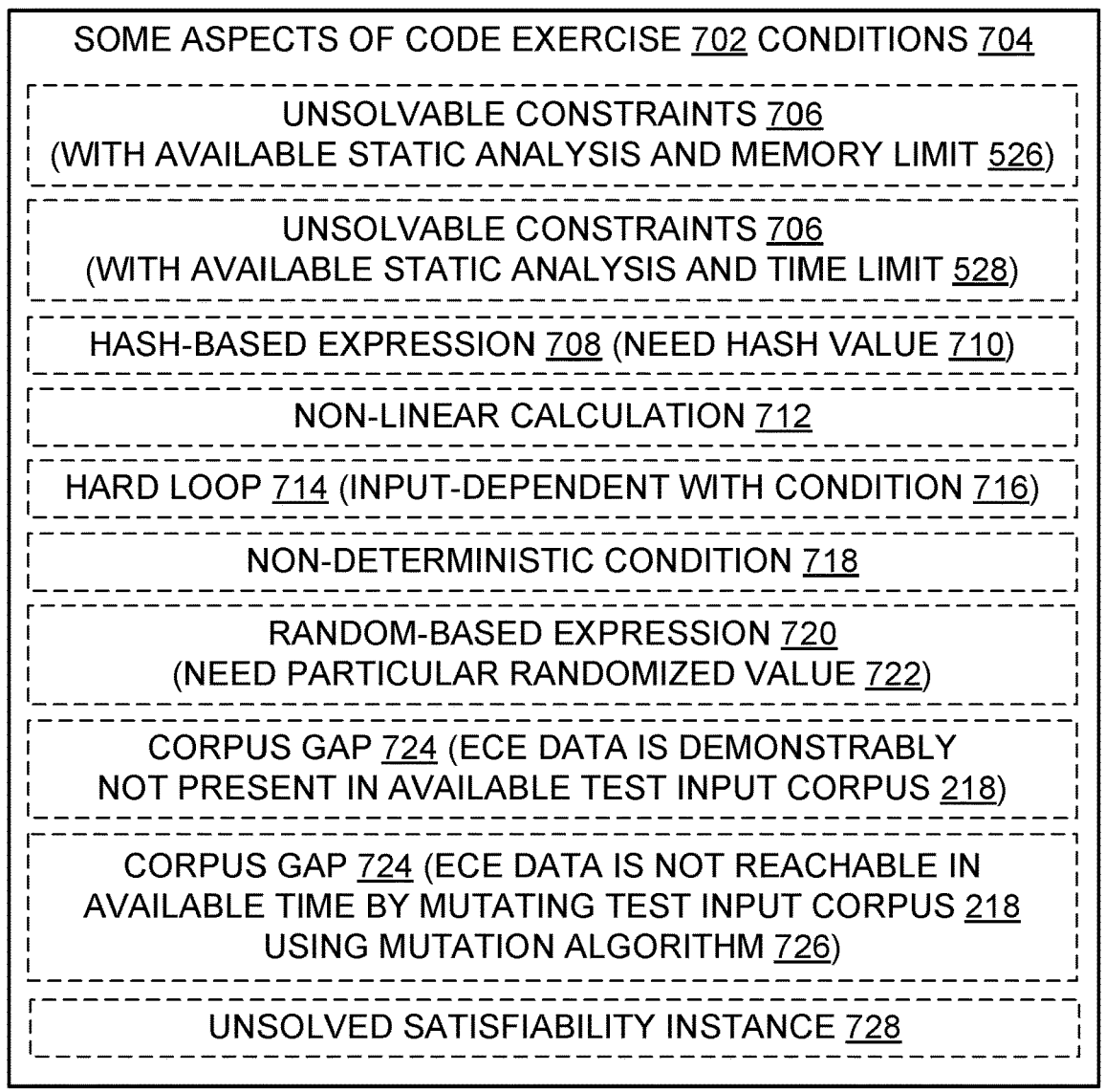
FIG. 7 is a block diagram illustrating some aspects of conditions which limit or prevent the exercise (i.e., execution) of code during testing.

FIG. 7 shows some aspects of conditions 704 on whether a portion of code in a program is exercised 702. In some situations, a code Y in a program 208 is not exercised because the user inputs, program memory state, or other ECE data 214 that would cause execution of that code Y is unknown and cannot be determined (at least not within given time/memory requirements) using SAT solvers, SMT solvers, or other static analysis tools. In some situations, previously unknown ECE data 214 allows the exercise of code Y that was otherwise prevented by hash-based expressions 708, non-linear calculations 712, certain loops 714, non-deterministic computations 718, random-based expressions 720, or gaps 724 in a test suite's input corpus 218.

Some gaps 724 occur when suitable ECE data 214 is demonstrably not present, e.g., all of the corpus has been input and the code Y still did not execute. Some gaps 724 occur when suitable ECE data 214 is unreachable, e.g., not only is it demonstrably not present, it is also not within reach within feasible time and memory usage limitations by fuzzing the corpus using a mutation algorithm 726. For example, if execution of code Y is conditioned on matching a 512-bit cryptographically secure hash of a password which contains at least twenty characters, and the corpus only includes a mechanism 726 and data 218 for generating passwords that are twelve characters or less, then a password to generate the desired hash is not reachable.

Figure 8:
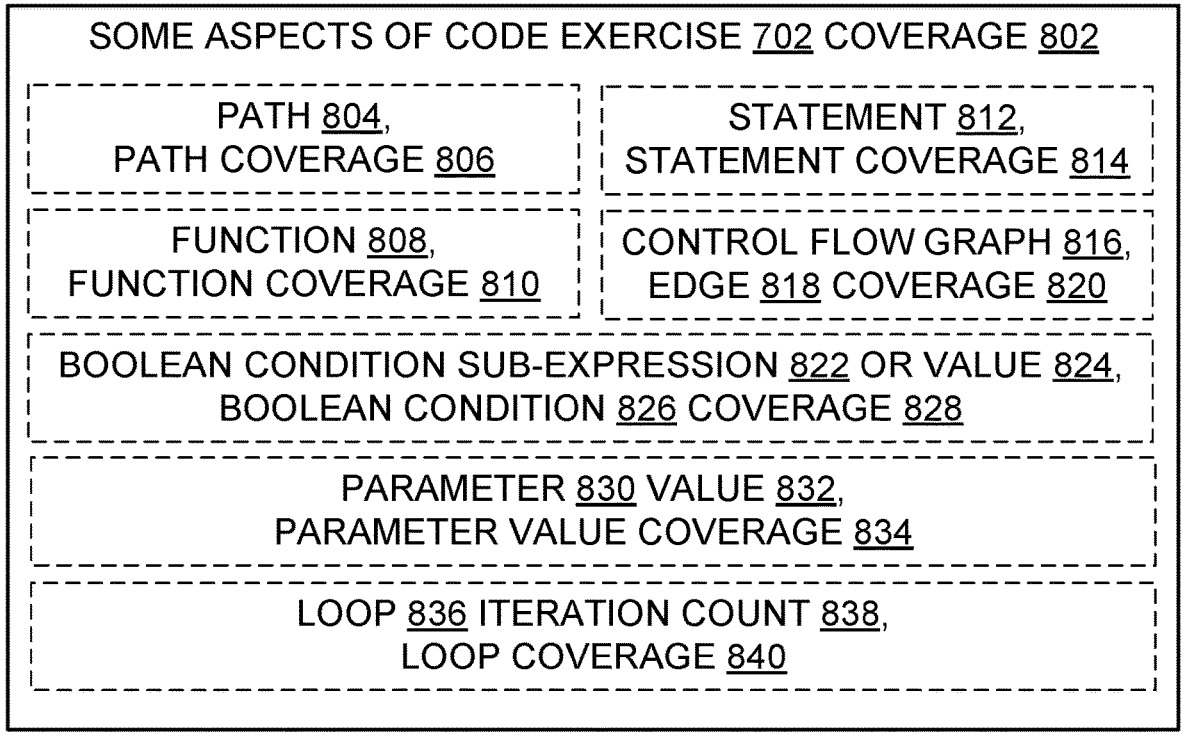
FIG. 8 is a block diagram illustrating some aspects of code coverage (also referred to as "code execution coverage" or "code exercise coverage")

FIG. 8 shows aspects of code execution coverage 802. These are enumerated elsewhere herein.

Figure 9:
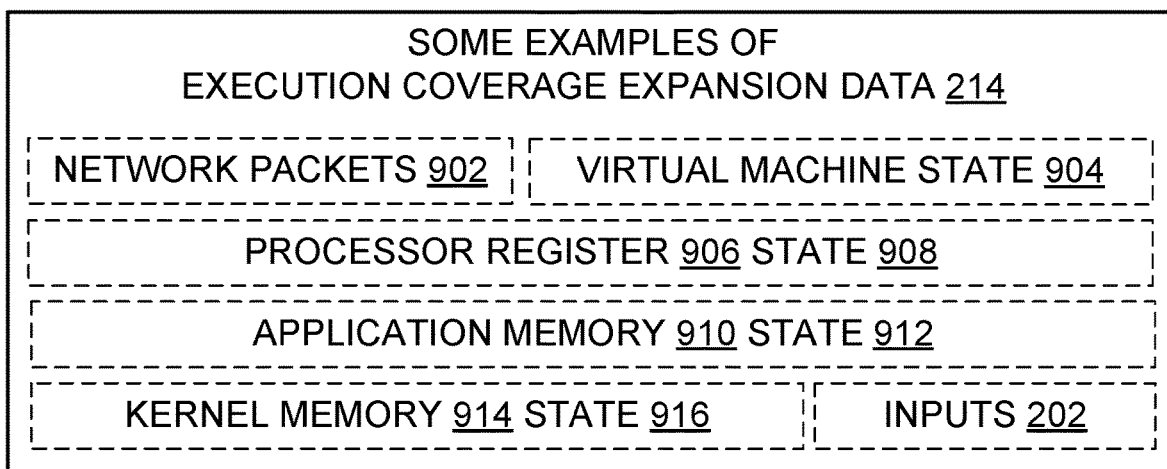
FIG. 9 is a block diagram illustrating some examples of ECE data.

FIG. 9 shows some examples of ECE data 214 sources and formats. The illustrated examples include network packets 902, virtual machine or container state 904, processor register state 908, application memory state 912, and kernel memory state 916. ECE data 214 may also come from other sources or take other formats than those shown in FIG. 9, e.g., storage, file system, program arguments, environment variables, and configuration.

Some embodiments use or provide a system 400 for expanding code execution coverage in a test environment 206, with the system including a processor 110, a memory 112 in operable communication with the processor, and a program 208. The program 208 may also be considered not a part of the system 400 per se, but is understood to be accessible to the system 400. The program 208 has at least one non-covered portion 404 and may have at least one covered portion 402. The non-covered portion 404 includes code 116 which is not exercised by a set of tests 216. The set of tests exercises the covered portion of the program but is insufficient to exercise the non-covered portion of the program.

In this example, the system 400 also includes a non-covered portion identifier 406 which has code that in operation identifies the non-covered portion. Non-covered portions may also be identified manually in some cases.

In this example, the system 400 also includes a trigger inserter 410 whose code upon execution with the processor inserts a trigger 408 in the program. The program 208 may exist in two or more copies, in which case the insertion of a trigger in any copy serves as insertion of a trigger "in the program." In particular, the trigger may be inserted in a capture copy 210 of the program in a capture environment 204 outside the test environment 206. The trigger is inserted at a position which permits the capture of data 214 which aids exercise of the non-covered portion. As used herein, "aids exercise" means that the data 214 could be processed, manipulated, or used to infer input that in turn exercises the non-covered portion, or the data itself is a direct cause of the non-covered potion being exercised. Some implementations may only modify 1014 a replicated virtual machine 304, so the client application in production use is unaffected.

In this example, the system 400 also includes a data capturer 412 whose code upon execution with the processor and in response to operation of the trigger captures data 214 which aids exercise of the non-covered portion in at least the test environment. Thus, code execution coverage 802 of the program is expanded in the test environment by the capture of data 214 which aids exercise of program code that was not being exercised previously by the set of tests.

Some embodiments further include a test set insufficiency detector 414 which upon execution with the processor detects that the set of tests 216 is insufficient to exercise the non-covered portion of the program. In such systems, the trigger inserter 410 may insert the trigger 408 in the program in response to operation of the test set insufficiency detector. Insufficiency may be detected, e.g., using familiar code coverage tools, or by inserting breakpoints 602, 604 or watchpoints 608 and noting which ones are not hit during test-driven program 208 execution.

In some embodiments, the program 208 includes a test copy 212 of the program and a capture copy 210 of the program. The test set insufficiency detector 414 detects that the set of tests 216 is insufficient to exercise the non-covered portion of the test copy of the program, so the trigger inserter 410 inserts the trigger in the capture copy 210 of the program. Then the data capturer 412 captures the ECE data 214 during execution of the capture copy of the program. The capture copy 210 can run as a production copy, for example.

In some embodiments, the insufficient set of tests 216 lacks one or more (possibly even all) of the following: fuzzing tests 502 which exercise the non-covered portion, integrated system tests 530 which exercise the non-covered portion, concolic tests 506 which exercise the non-covered portion, symbolic execution tests 518 which exercise the non-covered portion, and static analysis 522 tests which exercise the non-covered portion, manual tests that exercise the non-covered portion. Note that the inputs used for concolic testing are not necessarily from a fuzzed set of inputs. In some cases, inputs used for concolic testing could be derived from program analysis.

In some embodiments, the trigger 408 includes at least one of the following: a hardware breakpoint 602, a software breakpoint 604, a watchpoint 608, a processor trace extension 618 or capability 616, a CPU capability 616, a CPU extension 618, an off-CPU peripheral 614, a binary rewrite 606, a dynamic hook 620, or compiler instrumentation 612. In particular, a data-only watchpoint could be used as a trigger. Suppose a data structure in memory represents a state machine's state. The trigger could include a data watchpoint whereby for every state transition ECE data 214 is collected and stored. Once a completely new state is reached that should be logged and moved or copied to the test environment, the collector can reduce the state transition log into an input that reproduces the exact state again. In some embodiments, compilers 610, kernels, emulators, interpreters, or other code generators are enhanced to insert the instrumentation 612.

In some embodiments, the non-covered portion 404 of the program includes code whose exercise 702 is conditioned on at least one of the following code exercise conditions 704: one or more constraints 706 which are not solvable within a predetermined amount 526 of memory 112 by any static analysis tools available in the test environment; one or more constraints 706 which are not solvable within a predetermined amount of time 528 by any static analysis tools available in the test environment.

In some embodiments, the non-covered portion 404 of the program includes code whose exercise 702 is conditioned on at least one of the following code exercise conditions 704: an expression 708 which calculates or otherwise obtains a hash value 710; a non-linear calculation 712; an input-dependent loop 714 with a condition; a non-deterministic condition 718. One of skill informed by the present disclosure will acknowledge that these are merely examples of the kinds of code that may prevent analysis of some portion of a program. One may consider not only whether a program contains some code X of the kind 704 in question (hash expression, non-linear calculation, etc.), but also whether the code Y whose exercise is conditioned on code X is actually exercised by the relevant test set. For instance, an automated test set A created by some method of program analysis may fail to exercise code Y due to the presence of a non-linear calculation, whereas a different test set B may exercise code Y despite the presence of the non-linear calculation.

Some embodiments may be viewed as including in the system 400 the ECE data 214 that is captured by the data capturer. In some, the data 214 is characterized in that execution of the program 208 with the captured data 214 aids exercise of at least one of the following aspects of code execution 702 of the non-covered portion: a path 804, thereby expanding path coverage 806; a statement 812, thereby expanding statement coverage 814; a function 808, thereby expanding function coverage 810; a control flow graph edge 818, thereby expanding edge coverage 820; a Boolean condition sub-expression 822 or value 824, thereby expanding Boolean condition coverage 828; a parameter 830 value, thereby expanding parameter value coverage 834; or a loop iteration count 838, thereby expanding loop coverage 840.

Other system embodiments are also described herein, either directly or derivable as system versions of described processes or configured media, informed by the extensive discussion herein of computing hardware.

Although specific architectural examples are shown in the Figures, an embodiment may depart from those examples. For instance, items shown in different Figures may be included together in an embodiment, items shown in a Figure may be omitted, functionality shown in different items may be combined into fewer items or into a single item, items may be renamed, or items may be connected differently to one another.

Examples are provided herein to help illustrate aspects of the technology, but the examples given within this document do not describe all of the possible embodiments. Embodiments are not limited to the specific configurations, implementations, arrangements, displays, features, approaches, or scenarios provided herein. A given embodiment may include additional or different technical features, mechanisms, kinds of code, data structures, or functionalities for instance, and may otherwise depart from the examples provided herein.

Processes (a.k.a. Methods)

FIG. 10 illustrates execution coverage expansion in some embodiments, and thus helps illustrate both systems and methods. An embodiment identifies 1002 a non-covered portion of a program, and later inserts 1014 a trigger next to or in that non-covered portion to capture 1020 ECE data 214. In embodiments using static analysis 522, the embodiment may also ascertain 1006 that data 214 which satisfies 1008 certain conditions 1010 would exercise the non-covered portion, and may determine 1012 that the desired ECE data is not currently available in the test environment. When the trigger-equipped program executes 1016, at some point inputs and program state may activate 1018 the trigger. Triggers may also remain inactive, e.g., when non-covered code is actually unreachable or when the inputs that would exercise the non-covered code are never received. Captured 1020 ECE data is made 1022 available for future testing of the program, thereby expanding 1024 coverage 802 of the program. ECE data 214 may reside in a digital storage, database, or log collector, for example, and some embodiments also duplicate it and fuzz on it directly while it is stored in RAM memory upon capture. Length of storage depends on implementation, e.g., one may set a policy to fuzz every new state for X amount of hours and then drop the data.

Figure 11:
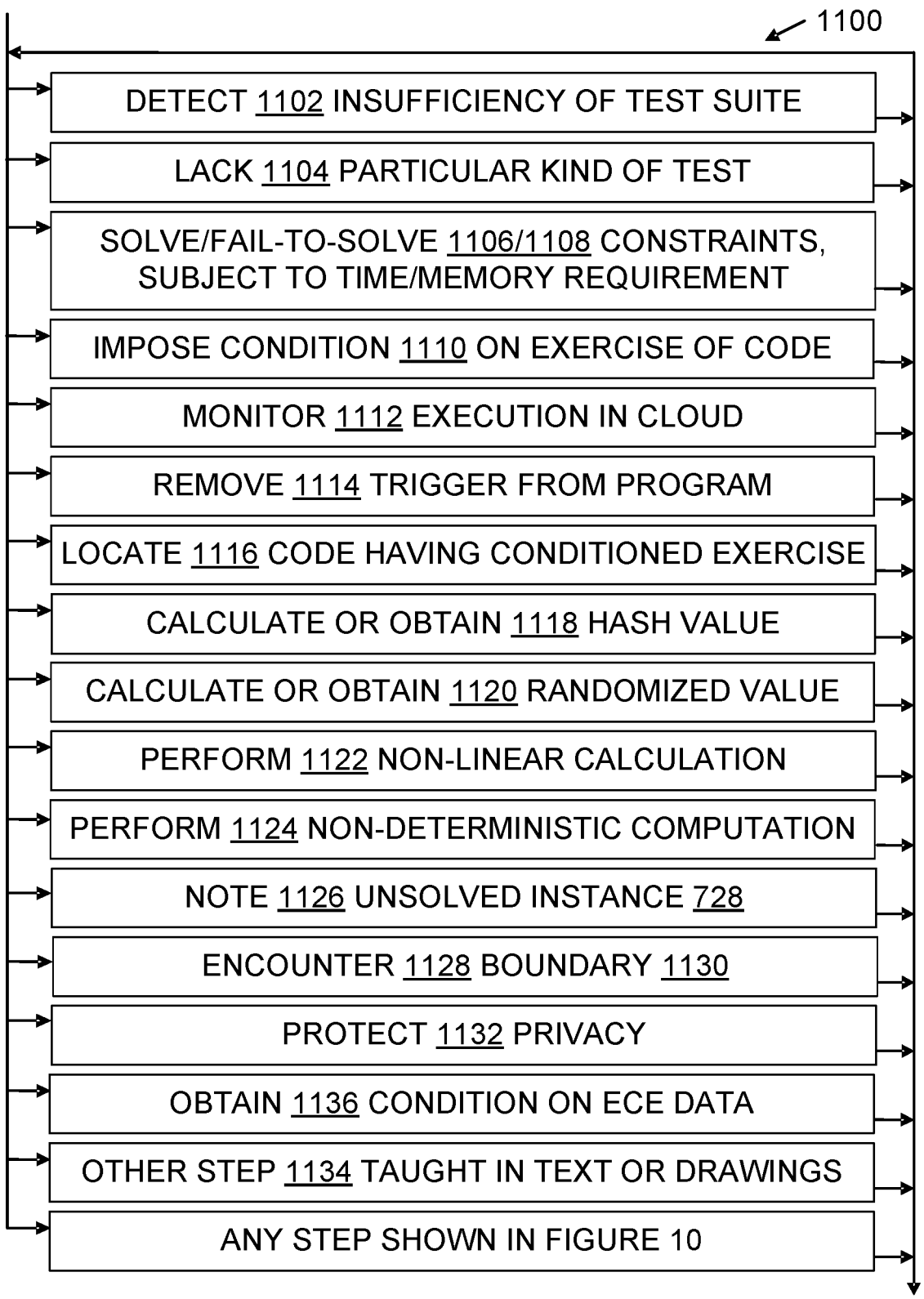
FIG. 11 is a flowchart further illustrating steps in some execution coverage expansion methods.

FIG. 11 further illustrates some execution coverage expansion methods, including some refinements, supplements, or contextual actions for steps shown in FIG. 10. Technical processes shown in the Figures or otherwise disclosed will be performed automatically, e.g., by enhanced system 400 or enhanced test tools 220 that have such functionality as taught herein, unless otherwise indicated. Processes may also be performed in part automatically and in part manually to the extent action by a human administrator or other human person is implicated, e.g., in some embodiments a person may manually identify 1002 a non-covered portion of a program. No process contemplated as innovative herein is entirely manual. In a given embodiment zero or more illustrated steps of a process may be repeated, perhaps with different parameters or data to operate on. Steps in an embodiment may also be done in a different order than the top-to-bottom order that is laid out in FIGS. 10 and 11. Steps may be performed serially, in a partially overlapping manner, or fully in parallel. In particular, the order in which flowchart 1000 action items or flowchart 1100 action items are traversed to indicate the steps performed during a process may vary from one performance of the process to another performance of the process. The flowchart traversal order may also vary from one process embodiment to another process embodiment. Steps may also be omitted, combined, renamed, regrouped, be performed on one or more machines, or otherwise depart from the illustrated flow, provided that the process performed is operable and conforms to at least one claim.

Some embodiments use or provide an execution coverage expansion method which includes identifying 1002 a non-covered portion of a program 208. The non-covered portion 404 includes code 116 which is not exercised by a set of tests 216 which exercise a covered portion 402 of the program. The method also includes ascertaining 1006 that an execution of the program with data which satisfies one or more conditions on the data would exercise the non-covered portion, and automatically determining 1012 that data 214 which satisfies 1008 the conditions on the data is unavailable in the test environment 206. The method also includes inserting 1014 a trigger 408 in the program, the trigger positioned to permit capture of data which aids exercise of the non-covered portion. In response to an activation 1018 of the trigger, the method automatically captures 1020 data which aids exercise of the non-covered portion during an execution of the program. Then the method automatically makes 1022 the captured data available in the test environment. Subsequently executing 1016 the program with the captured data aids exercise 702 of the non-covered portion and expands 1024 code execution coverage 802 of the program in the test environment.

In some embodiments, ascertaining 1006 that an execution of the program would exercise the non-covered portion includes automatically obtaining 1136 at least one condition on the data through one or more of the following: a static analysis 522, or a symbolic execution 516.

In some embodiments, ascertaining 1006 that an execution of the program would exercise the non-covered portion includes concolic testing 506.

In some embodiments, the set of tests includes fuzzing tests 502 and an input corpus 218 is employed by the fuzzing tests, and determining 1012 that data which satisfies 1008 the conditions is unavailable in the test environment includes determining 1102 that the non-covered portion was not exercised by any of the fuzzing tests employing the input corpus. Some embodiments add to the input corpus a new reconstructed test case based on the ECE data.

In some embodiments, determining 1012 that data which satisfies the conditions is unavailable in the test environment includes determining 1108 that a solvable set of linear equations whose solution includes the data is unavailable in the test environment.

In some embodiments, the method includes monitoring 1112 execution in a cloud 302 of a capture copy of the program in which the trigger was inserted 1014, and the method also includes in response to an activation 1018 of the trigger both capturing 1020 data which aids exercise of the non-covered portion and removing 1114 the trigger from the capture copy of the program. Removal 1114 may be performed, e.g., by removing a breakpoint, restoring a hooked address to its pre-hooking value, removing instrumentation 612, ignoring subsequent trigger activation, and so on. Monitoring 1112 execution in a cloud or other capture environment can provide an endless stream of concrete inputs, which can be selectively captured in response to trigger activation 1018.

In some embodiments, identifying 1002 the non-covered portion of the program includes locating 1116 a code designated here as code Y, and whether the code Y is exercised or is not exercised depends at least in part on an expression which does at least one of the following upon execution: calculates or otherwise obtains 1118 a hash value, calculates or otherwise obtains 1120 a random or pseudorandom value, performs 1122 a non-linear calculation, or performs 1124 a non-deterministic computation.

Configured Storage Media

Some embodiments include a configured computer-readable storage medium 112. Storage medium 112 may include disks (magnetic, optical, or otherwise), RAM, EEPROMS or other ROMs, and/or other configurable memory, including in particular computer-readable storage media (which are not mere propagated signals). The storage medium which is configured may be in particular a removable storage medium 114 such as a CD, DVD, or flash memory. A general-purpose memory, which may be removable or not, and may be volatile or not, can be configured into an embodiment using items such as ECE data 214, triggers 408, trigger inserters 410, data capturers 412, non-covered portion identifiers 406, test insufficiency detectors 414, enhanced tests 216, and an enhanced test input corpus 218, in the form of data 118 and instructions 116, read from a removable storage medium 114 and/or another source such as a network connection, to form a configured storage medium. The configured storage medium 112 is capable of causing a computer system 400 to perform technical process steps for program execution coverage expansion actions, as disclosed herein. The Figures thus help illustrate configured storage media embodiments and process (a.k.a. method) embodiments, as well as system and process embodiments. In particular, any of the process steps illustrated in FIG. 10 or 11, or otherwise taught herein, may be used to help configure a storage medium to form a configured storage medium embodiment.

Some embodiments use or provide a computer-readable storage medium 112, 114 configured with data 118 and instructions 116 which upon execution with a processor 110 perform a method for expanding code execution coverage 802 in a test environment 206. This method includes automatically determining 1012 that data 214 which would exercise a non-covered portion 404 of a program 208 is unavailable in a test environment 206, wherein exercise of the non-covered portion depends 1010 on at least one of the following: a hash value 710, a random or pseudorandom value 722, a non-linear calculation 712, a non-deterministic computation 718, data 118, 214 which is not present in any test input corpus 218 in the test environment, or a specific condition 704 that is not reachable off any test input corpus in the test environment within a predetermined time 528 using a mutation algorithm 726 of the test environment over multiple generations.

In this example, the method also includes inserting 1014 a trigger 408 in a copy of the program 208 outside the test environment, the trigger positioned to permit capture of data 214 which aids exercise of the non-covered portion. In response to an activation 1018 of the trigger, the method automatically captures 1020 data which aids exercise of the non-covered portion during an execution of the program outside the test environment. In this example, the method also automatically makes 1022 the captured data available in the test environment, thereby expanding 1024 code execution coverage of the program in the test environment.

In some embodiments, automatically determining 1012 that data which would exercise the non-covered portion of a program is unavailable in the test environment includes electronically noting 1126 an unsolved satisfiability modulo theory ("SMT") instance 728 of an automated SMT solver 510 or an unsolved Boolean satisfiability problem ("SAT") instance 728 of an automated SAT solver 512, or both.

In some embodiments, automatically determining 1012 that data which would exercise the non-covered portion of a program is unavailable in the test environment includes encountering 1128 a security boundary 1130 of the non-covered portion or a component boundary 1130 of the non-covered portion. In some situations, boundaries (e.g., security boundaries or component boundaries) exists that are not exercised by the corpus and are not reachable using the mutation algorithm within a reasonable amount of generations. A password may define such a boundary.

In some embodiments, capturing 1020 data which aids exercise of the non-covered portion during an execution of the program outside the test environment includes capturing data 118 which is subject to a privacy regulation, and the method further includes protecting 1132 privacy consistent with the privacy regulation. For example, captured PII (personally identifying information) in ECE data 214 may be encrypted, anonymized, masked, tokenized, or subjected to stricter access controls than non-PII data. An embodiment should have appropriate legal permissions from cloud provider clients or and other entities before gathering ECE data 214.

In some embodiments, capturing 1020 data which aids exercise of the non-covered portion during an execution of the program outside the test environment includes capturing at least one of the following: network packets 902, virtual machine state 904, processor register state 908, application memory state 912, or kernel memory state 916. Application data capture 1020 may depend on which programming language is used. Different programs 208 may call for different ways to gather execution coverage and state. With a Python application 208, for example, coverage trace and object state may be collected from the Python interpreter, instead of being gathered directly from the processor or memory.

Replicating an environment from a capture environment might be more than just copying memory—it could be copying applications, VMs, configuration, a set of workloads, some might be on managed instances (like a managed DB that is provided as a service but holds data that is relevant to the execution path). In some embodiments, replication includes copying code from memory, e.g., in the case of just-in time (JIT) compilers. The JIT-generated code could be a required part of the ECE data to be collected. Replication often depends on the application and type of migration required to replicate the production version on the test environment correctly, although not necessarily entirely. Some embodiments include a full reproduction of the same environment and state, while others employ only an approximation, e.g., because of storage and performance constraints.

As another example of use, teachings provided herein may be applied to reproduce a given execution path (or one close to it, if the test environment 206 is not a perfect reproduction of the state of the production environment 204 at the time of replication), with no changes, analysis, or mutation. One may employ this functionality to reproduce bugs detected in the production environment. For example, suppose the program 208 crashed in production but teachings herein had been applied to copy the state 214 for a particular point before the crash. The extracted information 214 could help one find the root cause of the problem underlying the crash. Repeating the same execution path can help engineers 104 trace the problem as it occurs at times in the flow.

As a particular example, consider an HTTP or HTTPS server 102, with a trigger 408 placed 1014 in an execution path right after the server consumes a request and before the server processes the request. Request processing may well be covered by a test 216, but such as location is a chokepoint for at least part of the processing. For a small percentage of the requests, the state 214 is copied over and saved. If the server crashes intermittently, engineers can find a copied state of a request that was collected in the same execution flow before a crash is dumped, and use that replicated state to reproduce the environment before the bug happened. A trigger 408 activation rate can be configured in the production environment and be manually changed across the lifetime of the server, based for instance on performance or storage constraints and a perceived probability of a bug occurring in the environment. As a version of the program 208 matures in the environment, the number of states 214 collected can be reduced. Conversely, engineers can increase the number of states 214 collected if they have trouble reproducing a specific bug.

Additional Examples and Observations

One of skill will recognize that not every part of this disclosure, or any particular details therein, are necessarily required to satisfy legal criteria such as enablement, written description, or best mode. Also, embodiments are not limited to the particular parameters, threshold values, range endpoints, networks, tools, identifiers, fields, data structures, functions, constants, or other implementation choices described herein. Any apparent conflict with any other patent disclosure, even from the owner of the present innovations, has no role in interpreting the claims presented in this patent disclosure. With this understanding, which pertains to all parts of the present disclosure, some additional examples and observations are offered.

Condition 704 code examples. As discussed in the present disclosure, in some embodiments a non-covered portion 404 of a program includes a code Y whose exercise is conditioned on some code X. Bearing in mind that the following pieces of code or pseudocode are merely examples, and not meant to exhaustively catalog all possible conditions 704, 1010, one of skill may nonetheless find the following of interest.

One example of an expression 708 which calculates or otherwise obtains a hash value is "md5(input)==x", where md5( ) performs an MD5 message digest computation. Such code exemplifies situations in which the system 400 is employed to go harvest data from "real" users 104 (as opposed to test personnel) or machines operating on behalf of such users 104, who are using the program 208 because an interesting part of the program is guarded by a hash condition, and the data 214 that includes input to the hash to exercise the guarded code is not part of the test data 216, 218.

One example of an input-dependent number of conditions loop 714 is "while (x !=z) {x*=y}". This is also an example of an input-dependent loop 716 with a condition.

One example of non-linear calculation 712 is code using sources which have a non-linear dependency on one another. This includes, e.g., "read(x); if (x*x==x+x) { . . . }". Some other examples of non-linear calculation 712 include hashing 708, "x*x", "if (a*a==b)", and "while (a !=b) {a*=c; a %=d;}".

As another observation, making execution conditional upon a value x where "x=random( )" may be an example of a non-linear calculation 712, but often an implementation of random number generation that isn't cryptographically secure is linear (e.g., a linear congruential generator algorithm used in some C programming language libraries). For a cryptographically secure random number generation, an SMT solver 510 or SAT solver 512 wouldn't work, so non-linear calculation 712 is involved. Even for some non-cryptographically secure random number generation algorithms such as the Mersenne Twister algorithm, however, in some systems the state size and number of equations will be too large to be satisfied 1008 in a reasonable time 528 or space 526. In particular, constraints 514 may be unsolvable as a practical matter when they involve a large number of dependent variables and a large number of dependent conditions that cannot be easily simplified.

One example of code 718 having a non-deterministic number of conditions is "while (random( )) {if (x==y) {break;} x+=2}".

Path coverage 806. Closer examination of the challenge of distinguishing between covered paths and non-covered paths reveals some subtleties. Consider for example the case of the code snippet "if (a==x||b==y) {memcpy(dst, src, y*(b==y));}". While this could be compiled in some systems to machine code with a single branch, resulting in the same path coverage both for b !=y and b==y as long as a==x, some embodiments taught herein can capture data 214 for the Boolean condition b==y for which the code behaves differently.

Assembly-level pseudocode of this snippet could look like:
// assume a on rax, b on rbx, x on rsi, y on rdi
sete rax, rsi
sete rbx, rdi
or rax, rbx
jz end
// at this point, the condition is met (because of either terms) but now rbx
holds 1 if b==y and 0 if b !=y
neg rbx // if (b !=y) this will stay 0, otherwise rbx will be −1 which is 0xffffffffffffffff in two's complement
and rbx, rdi // rbx now holds the memcpy length parameter, either 0 if b !=y or y if b==y
// at this point call memcpy(dst, src, length that we just calculated and is stored on rbx)
// . . .

This example leads to a technical challenge in that a coverage guided fuzzer 504 might satisfy the condition with a==x and b !=y, then assume 100% coverage and could stop mutating the input 218. By contrast, if this condition is met in a real world environment 204 with b==y then an embodiment 400 could pick up the corresponding input 214, by triggering 1018 regardless of the apparent or presumed coverage 806 for the branch. Accordingly, teachings herein may be applied in situations where there are various reasons to collect inputs at a specific location, e.g., capture 1020 could be predetermined, random, heuristic, or based on supplemental analysis of the code 208.

Password example code and discussion. The listing below provides an additional of a code exercise challenge that a fuzzer or manually created artificial inputs will not be able to solve. A real password is required, in order to get to the vulnerable code 404 which copies a string to a buffer using strcpy( ) with no test to prevent overflowing the buffer when the string is too large to fit entirely in the buffer:

```
int vulnerable(const char *password, const char *data) {
    char buffer[128];
    if              (strcmp(md5(password),
       "f42065be33302a2cb1c8550e949af86e")==0) {strcpy
       (buffer, data);
    }
    return 0;
}
```

There is a vulnerability in call to strcpy( ), namely, a buffer overflow vulnerability. To get to that call, execution must pass the if condition on the line above, which assumes the correct password was inputted to generate the quoted md5 hash (the correct password is "westphiladelphiabornandraised"). Therefore, an application 208 containing the vulnerable( ) code listed above will crash as a result of executing this listed code only if (a) the password argument provided is "westphiladelphiabornandraised", and (b) the length of data string provided is large enough (over 128 bytes in storage) to cause a crash, and (c) the portion of data string that overflows the buffer also overwrites memory in a way that causes a crash.

Now consider and compare several different methods to test this vulnerable( ) function.

Manual testing 216 is inadequate; unless there is a test defined explicitly to satisfy both constraints, this flow will never be reachable. The extremely large space of possible passwords makes it very unlikely manual testing will hit on the correct password without being defined with the correct password.

Fuzzing tests 502 depend on the corpus and the arguments mutated. If the initial corpus contains the password in the first place (meaning, testing was intended to partially cover this flow), then a fuzzer 504 might be able to reach a crash. Otherwise, it is very unlikely to mutate the password argument to correctly satisfy the password check condition. Another disadvantage of fuzzing tests is that they can be hard to replicate; since one can't always reset the state of the fuzzer, a crash might happen when there are no records of previous inputs. Also, when fuzzing an app 208, 212, testers may run a constant number of app virtual machines for a limited time. By contrast, a system 400 may run for as long as the app 208, 210 runs, with as many or as few virtual machines or containers as the real-world app 210 execution employs.

As to symbolic execution tests 518, a static analyzer 524 will be able to identify the condition but will not be able to convert the MD5 function into a set of linear equations to solve.

Traditional concolic testing 506 (that is, lacking enhancement as taught herein) with fuzzing input will not be able to reach the strcpy( ) call if the password is not in the input corpus, and therefore will not be able to find a concrete input that satisfies the condition.

Now consider an embodiment as taught herein. In this example, assume the embodiment is monitoring 1112 a process on the same machine 102 that was previous used for testing 216 with the previous methods outlined above (manual, fuzzing, symbolic execution, concolic). Thus, the system 400 has already analyzed the conditions to reach coverage, even though it cannot solve them.

This particular embodiment will get coverage feedback using breakpoints. When the application 208 first runs, the monitoring process 412 attaches to it and inserts a breakpoint at the strcpy( ) call. While the application runs and serves real users, the breakpoint will not be hit until the right input for the password argument is being processed. Once one of the customers enters the right password, the breakpoint will be hit, and the monitoring process 412 will now copy the process memory 910 and return execution back to its normal flow. In this example, the monitoring process will also remove 1114 the breakpoint. Note that coverage expansion 1024 didn't interrupt or change the business logic, and the application continues to run with the input given. That input will not necessarily cause a crash, e.g., because data passed to the strcpy( ) may have been too short to overflow the buffer, as noted above.

With the duplicated state 214, from the application frozen right after the condition 1010 is satisfied, one can then inspect the memory and extract a concrete value for the password. This new information can be used to synthesize the right input to the vulnerable( ) function to exercise its body, and the program 208 will now have a larger code coverage 802. With this new input and further fuzzing of the "data" variable, an embodiment will likely find the buffer overflow vulnerability. This additional fuzzing may happen in a separate environment 206 than the production environment 306 in which the process continues serving customers 104. After reaching a formerly non-reachable state, one may use familiar techniques to further expand the new execution paths, e.g., fuzzing, manually specified artificial inputs. A newly found path might contribute constraints during concolic testing; the new state and concrete inputs may be able to solve a constraint such as "a*a==b" that are traditionally problematic in such systems.

Some Additional Combinations and Variations

Any of these combinations of code, data structures, logic, components, communications, and/or their functional equivalents may also be combined with any of the systems and their variations described above. A process may include any steps described herein in any subset or combination or sequence which is operable. Each variant may occur alone, or in combination with any one or more of the other variants. Each variant may occur with any of the processes and each process may be combined with any one or more of the other processes. Each process or combination of processes, including variants, may be combined with any of the configured storage medium combinations and variants described above.

Conclusion

In short, the teachings provided herein may be applied to enhance execution coverage 802 of a program 208. Program execution coverage 802 is expanded 1024 by selectively capturing 1020 inputs 202 and execution state information 904, 908, 912, 916 and other data 214 in a production environment 306 or other capture environment 204 after identifying 1012 test insufficiencies in a test environment 206. A program 208 being tested 216 has a non-covered portion 404 and a covered portion 402. The non-covered portion 404 includes code which is not exercised 702 by a set of tests 216 with regard to an execution coverage 802, e.g., path coverage 806, statement coverage 814, Boolean condition coverage 828, function coverage 810, parameter value coverage 834, loop coverage 840, etc. Full execution coverage for a piece of code does not require that one be able to reduce all possible inputs and outputs back to the test suite and prove that the code behaves correctly. Teachings provided herein are useful even when such reduction and proof is not feasible.

In this context, a non-covered portion identifier 406 identifies 1002 the non-covered portion 404, e.g., by noting breakpoint misses or static analysis constraint solution computational requirements 526, 528. A trigger inserter 410 inserts 1014 a trigger 408 in the program, at a position which permits capture 1020 of data which aids exercise of 702 the non-covered portion 404. A data capturer 412 captures 1020 such execution coverage expansion data ("ECE data") 214 in response to trigger activation 1018. Captured ECE data 214 is automatically made available 1022 in the test environment 206, thus expanding 1024 code execution coverage 802 of the program 208 in the test environment 206.

Embodiments are understood to also include or benefit from tested and appropriate security controls and privacy controls, e.g., it is understood that appropriate measures should be taken to only obtain ECE data legally, to help prevent misuse of the ECE data, and to help avoid tampering with the testing. Use of the tools and techniques taught herein is compatible with use of such controls.

Although particular embodiments are expressly illustrated and described herein as processes, as configured storage media, or as systems, it will be appreciated that discussion of one type of embodiment also generally extends to other embodiment types. For instance, the descriptions of processes in connection with FIGS. 10 and 11 also help describe configured storage media, and help describe the technical effects and operation of systems and manufactures like those discussed in connection with other Figures. It does not follow that limitations from one embodiment are necessarily read into another. In particular, processes are not necessarily limited to the data structures and arrangements presented while discussing systems or manufactures such as configured memories.

Those of skill will understand that implementation details may pertain to specific code, such as specific APIs, specific fields, specific kinds of components, and specific sample programs, and thus need not appear in every embodiment. Those of skill will also understand that program identifiers and some other terminology used in discussing details are implementation-specific and thus need not pertain to every embodiment. Nonetheless, although they are not necessarily required to be present here, such details may help some readers by providing context and/or may illustrate a few of the many possible implementations of the technology discussed herein.

Reference herein to an embodiment having some feature X and reference elsewhere herein to an embodiment having some feature Y does not exclude from this disclosure embodiments which have both feature X and feature Y, unless such exclusion is expressly stated herein. All possible negative claim limitations are within the scope of this disclosure, in the sense that any feature which is stated to be part of an embodiment may also be expressly removed from inclusion in another embodiment, even if that specific exclusion is not given in any example herein. The term "embodiment" is merely used herein as a more convenient form of "process, system, article of manufacture, configured computer readable storage medium, and/or other example of the teachings herein as applied in a manner consistent with applicable law." Accordingly, a given "embodiment" may include any combination of features disclosed herein, provided the embodiment is consistent with at least one claim.

Not every item shown in the Figures need be present in every embodiment. Conversely, an embodiment may contain item(s) not shown expressly in the Figures. Although some possibilities are illustrated here in text and drawings by specific examples, embodiments may depart from these examples. For instance, specific technical effects or technical features of an example may be omitted, renamed, grouped differently, repeated, instantiated in hardware and/or software differently, or be a mix of effects or features appearing in two or more of the examples. Functionality shown at one location may also be provided at a different location in some embodiments; one of skill recognizes that functionality modules can be defined in various ways in a given implementation without necessarily omitting desired technical effects from the collection of interacting modules viewed as a whole. Distinct steps may be shown together in a single box in the Figures, due to space limitations or for convenience, but nonetheless be separately performable, e.g., one may be performed without the other in a given performance of a method.

Reference has been made to the figures throughout by reference numerals. Any apparent inconsistencies in the phrasing associated with a given reference numeral, in the figures or in the text, should be understood as simply broadening the scope of what is referenced by that numeral. Different instances of a given reference numeral may refer to different embodiments, even though the same reference numeral is used. Similarly, a given reference numeral may be used to refer to a verb, a noun, and/or to corresponding instances of each, e.g., a processor 110 may process 110 instructions by executing them.

As used herein, terms such as "a" and "the" are inclusive of one or more of the indicated item or step. In particular, in the claims a reference to an item generally means at least one such item is present and a reference to a step means at least one instance of the step is performed.

Headings are for convenience only; information on a given topic may be found outside the section whose heading indicates that topic.

All claims and the abstract, as filed, are part of the specification.

To the extent any term used herein implicates or otherwise refers to an industry standard, and to the extent that applicable law requires identification of a particular version of such as standard, this disclosure shall be understood to refer to the most recent version of that standard which has been published in at least draft form (final form takes precedence if more recent) as of the earliest priority date of the present disclosure under applicable patent law.

While exemplary embodiments have been shown in the drawings and described above, it will be apparent to those of ordinary skill in the art that numerous modifications can be made without departing from the principles and concepts set forth in the claims, and that such modifications need not encompass an entire abstract concept. Although the subject matter is described in language specific to structural features and/or procedural acts, it is to be understood that the subject matter defined in the appended claims is not necessarily limited to the specific technical features or acts described above the claims. It is not necessary for every means or aspect or technical effect identified in a given definition or example to be present or to be utilized in every embodiment. Rather, the specific features and acts and effects described are disclosed as examples for consideration when implementing the claims.

All changes which fall short of enveloping an entire abstract idea but come within the meaning and range of equivalency of the claims are to be embraced within their scope to the full extent permitted by law.

What is claimed is:

1. A system for expanding code execution coverage in a test environment, the system comprising:
    a processor;
    a memory in operable communication with the processor;
    a program having a non-covered portion and a covered portion, the non-covered portion including code which is not exercised by a set of tests which exercises the covered portion of the program but is insufficient to exercise the non-covered portion of the program;
    a non-covered portion identifier which identifies the non-covered portion;
    a trigger inserter which upon execution with the processor inserts a trigger in the program, the trigger inserted at a position which permits capture of data which aids exercise of the non-covered portion;
    a data capturer which upon execution with the processor and in response to operation of the trigger captures data which aids exercise of the non-covered portion in at least the test environment;
    whereby code execution coverage of the program is expanded in the test environment by the capture of data which aids exercise of program code that was not being exercised previously by the set of tests.

2. The system of claim 1, further comprising a test set insufficiency detector which upon execution with the processor detects that the set of tests is insufficient to exercise the non-covered portion of the program, and wherein the trigger inserter inserts the trigger in response to operation of the test set insufficiency detector.

3. The system of claim 2, wherein:
the program comprises a test copy of the program and a capture copy of the program;
the test set insufficiency detector detects that the set of tests is insufficient to exercise the non-covered portion of the test copy of the program;
the trigger inserter inserts the trigger in the capture copy of the program; and
the data capturer captures the data during execution of the capture copy of the program.

4. The system of claim 1, wherein the insufficient set of tests lacks all of the following: fuzzing tests which exercise the non-covered portion, integrated system tests which exercise the non-covered portion, concolic tests which exercise the non-covered portion, symbolic execution tests which exercise the non-covered portion, and static analysis tests which exercise the non-covered portion.

5. The system of claim 1, wherein the trigger comprises at least one of the following: a hardware breakpoint, a software breakpoint, a watchpoint, a processor trace, a CPU capability, a CPU extension, an off-CPU peripheral, a binary rewrite, a dynamic hook, or compiler instrumentation.

6. The system of claim 1, wherein the non-covered portion of the program comprises code whose exercise is conditioned on at least one of the following:
one or more constraints which are not solvable within a predetermined amount of memory by any static analysis tools available in the test environment;
one or more constraints which are not solvable within a predetermined amount of time by any static analysis tools available in the test environment.

7. The system of claim 1, wherein the non-covered portion of the program comprises code whose exercise is conditioned on at least one of the following:
an expression which calculates or otherwise obtains a hash value;
a non-linear calculation;
an input-dependent loop with a condition;
a non-deterministic condition.

8. The system of claim 1, further comprising data captured by the data capturer, wherein said data is characterized in that execution of the program with the captured data exercises at least one of the following aspects of code execution of the non-covered portion:
a path, thereby expanding path coverage;
a statement, thereby expanding statement coverage;
a function, thereby expanding function coverage;
a control flow graph edge, thereby expanding edge coverage;
a Boolean condition sub-expression or value, thereby expanding Boolean condition coverage;
a parameter value, thereby expanding parameter value coverage;
a loop iteration count, thereby expanding loop coverage.

9. A method for expanding code execution coverage in a test environment, the method implemented with a computer system equipped with at least one processor having thereon memory-stored instructions which, when executed by the processor, cause the processor to perform the method, comprising:
identifying a non-covered portion of a program, the non-covered portion including code which is not exercised by a set of tests which exercise a covered portion of the program;
ascertaining that an execution of the program with data which satisfies one or more conditions on the data would exercise the non-covered portion;
automatically determining that data which satisfies the conditions on the data is unavailable in the test environment;
inserting a trigger in the program, the trigger positioned to permit capture of data which aids exercise of the non-covered portion;
in response to an activation of the trigger, automatically capturing data which aids exercise of the non-covered portion during an execution of the program; and
automatically making the captured data available in the test environment; and
executing the program with the captured data, thereby exercising the non-covered portion and expanding code execution coverage of the program in the test environment.

10. The method of claim 9, wherein ascertaining that an execution of the program would exercise the non-covered portion comprises automatically obtaining at least one condition on the data through one or more of the following: a static analysis, or a symbolic execution.

11. The method of claim 9, wherein ascertaining that an execution of the program would exercise the non-covered portion comprises concolic testing.

12. The method of claim 9, wherein the set of tests includes fuzzing tests and an input corpus is employed by the fuzzing tests, and wherein determining that data which satisfies the conditions is unavailable in the test environment comprises determining that the non-covered portion was not exercised by any of the fuzzing tests employing the input corpus.

13. The method of claim 9, wherein determining that data which satisfies the conditions is unavailable in the test environment comprises determining that a solvable set of linear equations whose solution includes the data is unavailable in the test environment.

14. The method of claim 9, wherein the method comprises monitoring execution in a cloud of a capture copy of the program in which the trigger was inserted, and the method also comprises in response to an activation of the trigger both capturing data which aids exercise of the non-covered portion and removing the trigger from the capture copy of the program.

15. The method of claim 9, wherein identifying the non-covered portion of the program comprises locating a code designated here as code Y, and wherein whether the code Y is exercised or is not exercised depends at least in part on an expression which does at least one of the following upon execution:
calculates or otherwise obtains a hash value;
calculates or otherwise obtains a random or pseudorandom value;
performs a non-linear calculation; or
performs a non-deterministic computation.

16. A computer-readable storage medium configured with data and instructions which upon execution with a processor perform a method for expanding code execution coverage in a test environment, the method comprising:
automatically determining that data which would exercise a non-covered portion of a program is unavailable in a test environment, wherein exercise of the non-covered portion depends on at least one of the following:
a hash value,
a random or pseudorandom value,
a non-linear calculation,
a non-deterministic computation,
data which is not present in any test input corpus in the test environment, or
a specific condition that is not reachable off any test input corpus in the test environment within a predetermined time using a mutation algorithm of the test environment over multiple generations;

inserting a trigger in a copy of the program outside the test environment, the trigger positioned to permit capture of data which aids exercise of the non-covered portion;

in response to an activation of the trigger, automatically capturing data which aids exercise of the non-covered portion during an execution of the program outside the test environment; and automatically making the captured data available in the test environment, thereby expanding code execution coverage of the program in the test environment.

17. The storage medium of claim 16, wherein automatically determining that data which would exercise the non-covered portion of a program is unavailable in the test environment comprises electronically noting an unsolved satisfiability modulo theory ("SMT") instance of an automated SMT solver or an unsolved Boolean satisfiability problem ("SAT") instance of an automated SAT solver, or both.

18. The storage medium of claim 16, wherein automatically determining that data which would exercise the non-covered portion of a program is unavailable in the test environment comprises encountering a security boundary of the non-covered portion or a component boundary of the non-covered portion.

19. The storage medium of claim 16, wherein capturing data which aids exercise of the non-covered portion during an execution of the program outside the test environment comprises capturing data which is subject to a privacy regulation, and the method further comprises protecting privacy consistent with the privacy regulation.

20. The storage medium of claim 16, wherein capturing data which aids exercise of the non-covered portion during an execution of the program outside the test environment comprises capturing at least one of the following: network packets, virtual machine state, processor register state, application memory state, kernel memory state.

* * * * *